US008502149B2

(12) United States Patent
Tsuchiya

(10) Patent No.: US 8,502,149 B2
(45) Date of Patent: Aug. 6, 2013

(54) THERMAL DETECTOR, THERMAL DETECTION DEVICE, ELECTRONIC INSTRUMENT, AND THERMAL DETECTOR MANUFACTURING METHOD

(75) Inventor: Yasushi Tsuchiya, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 50 days.

(21) Appl. No.: 13/329,449

(22) Filed: Dec. 19, 2011

(65) Prior Publication Data
US 2012/0161003 A1 Jun. 28, 2012

(30) Foreign Application Priority Data

| Dec. 22, 2010 | (JP) | 2010-286334 |
| Dec. 27, 2010 | (JP) | 2010-289491 |
| Dec. 27, 2010 | (JP) | 2010-289492 |
| Jan. 24, 2011 | (JP) | 2011-012060 |
| Feb. 23, 2011 | (JP) | 2011-036886 |

(51) Int. Cl.
G01J 5/00 (2006.01)
(52) U.S. Cl.
USPC .................................................. 250/338.3
(58) Field of Classification Search
USPC ............... 250/338.1–338.5, 339.01–339.15, 250/340, 341.1–341.8
See application file for complete search history.

(56) References Cited

U.S. PATENT DOCUMENTS 6,465,784 B1 10/2002 Kimata
6,781,128 B2 * 8/2004 Hirota et al. ............... 250/338.1

FOREIGN PATENT DOCUMENTS

| JP | 2000-019010 A | 1/2000 |
| JP | 3339276 B2 | 10/2002 |
| WO | WO-99/31471 A1 | 6/1999 |

* cited by examiner

Primary Examiner — Kiho Kim
(74) Attorney, Agent, or Firm — Global IP Counselors, LLP

(57) ABSTRACT

A thermal detector includes: a substrate; a support member supported so that a cavity is formed between the substrate and the support member; a heat-detecting element supported on the support member; a thermal transfer member disposed over the heat-detecting element, and including a thermal collecting portion made of a material having light-reflecting characteristics and having a pattern with which a portion of light incident to a region defined by the support member as seen in plan view enters towards the support member, and a connecting portion connecting the thermal collecting portion to the heat-detecting element; a first light-absorbing layer contacting the thermal transfer member between the thermal transfer member and the support member; and a second light-absorbing layer contacting the thermal transfer member and disposed on the thermal transfer member.

20 Claims, 24 Drawing Sheets

P1: Resonance Peak of First Resonator
P2: Resonance Peak of Second Resonator
P3: Detection Sensitivity of Thermal Detector

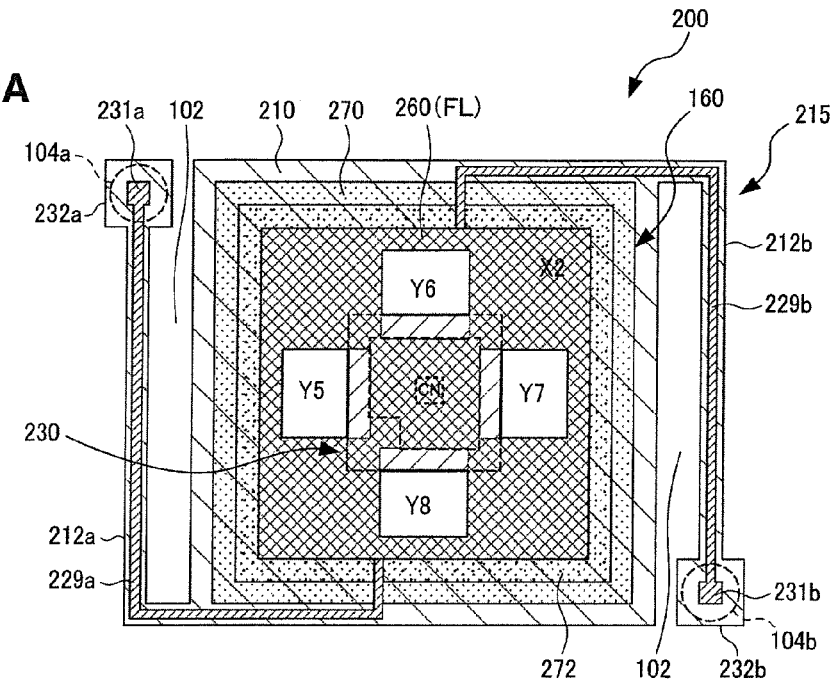
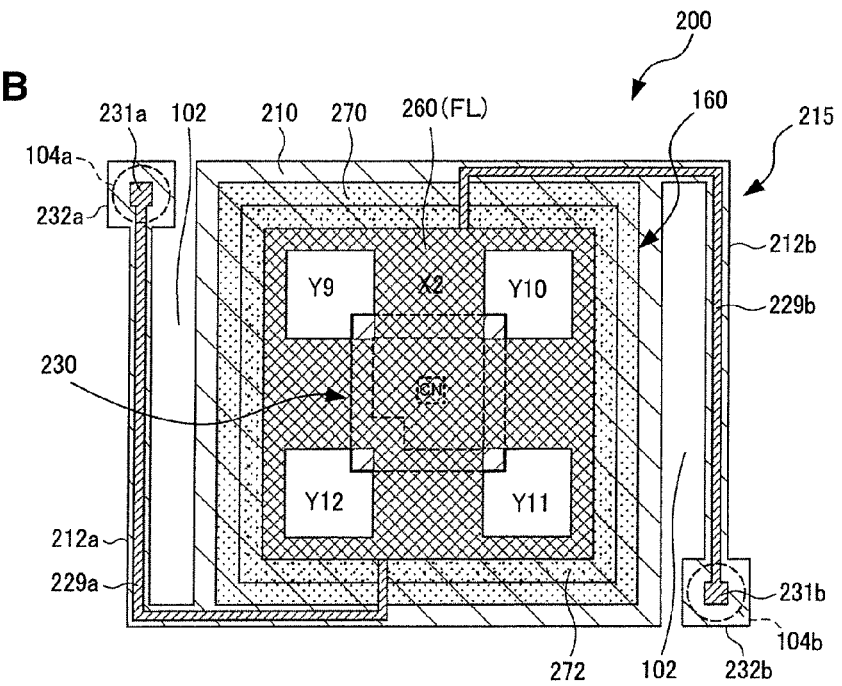

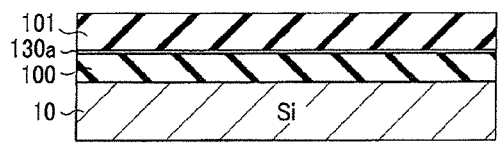
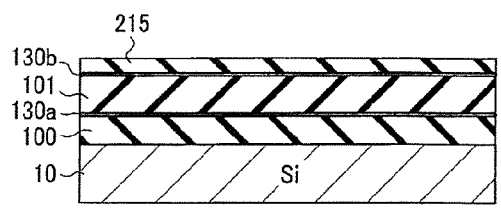
Fig. 13A    Fig. 13B
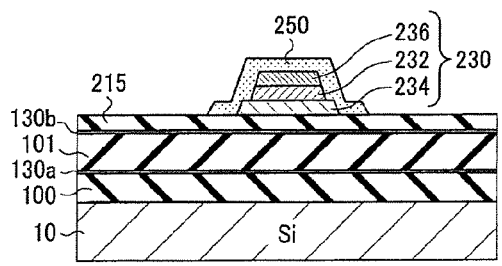
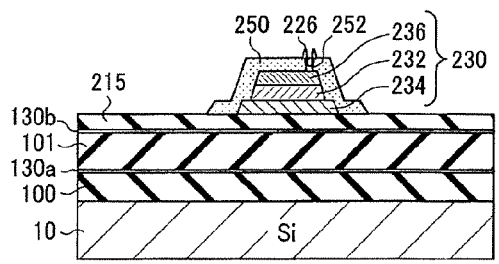
Fig. 13C    Fig. 13D
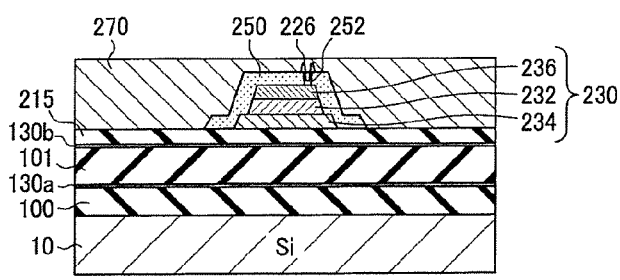
Fig. 13E

THERMAL DETECTOR, THERMAL DETECTION DEVICE, ELECTRONIC INSTRUMENT, AND THERMAL DETECTOR MANUFACTURING METHOD

CROSS-REFERENCE TO RELATED APPLICATIONS

This application claims priority to Japanese Patent Application No. 2010-286334 filed on Dec. 22, 2010, Japanese Patent Application No. 2010-289491 filed on Dec. 27, 2010, Japanese Patent Application No. 2010-289492 filed on Dec. 27, 2010, Japanese Patent Application No. 2011-012060 filed on Jan. 24, 2011 and Japanese Patent Application No. 2011-036886 filed on Feb. 23, 2011. The entire disclosures of Japanese Patent Application Nos. 2010-286334, 2010-289491, 2010-289492, 2011-012060 and 2011-036886 are hereby incorporated herein by reference.

BACKGROUND

1. Technical Field

The present invention relates to a thermal detector, a thermal detection device, an electronic instrument, and a thermal detector manufacturing method.

2. Related Art

Thermal detection devices are known as light sensors. Thermal detectors absorb light that has been emitted from an object in a light-absorbing layer, convert the light to heat, and measure the change in temperature with a heat-detecting element. Thermal detectors include thermopiles that directly detect the increase in temperature accompanying light absorption, pyroelectric type elements that detect a change in electrical polarity, and bolometers that detect the increase in temperature as a change in resistance. Thermal detectors have a characteristically wide wavelength range over which measurements can be made. In recent years, semiconductor fabrication technologies (e.g., MEMS) have been used, and the production of smaller-scale thermal detectors has been attempted.

In order to increase detection sensitivity and improve response in thermal detectors, it is critical to efficiently transfer the heat that is generated in the light-absorbing layer to the heat-detecting element.

The structure of a heat-detecting element for improving thermal transfer efficiency is described, for example, in Japanese Patent No. 3339276. The infrared detecting element described in this publication (herein referred to as a thermopile type infrared detecting element) has a highly thermally conducting layer that is provided between an infrared light sensing part and an infrared light absorbing layer. Specifically, a membrane is formed over a cavity, and the membrane is supported on the surrounding substrate by protruding beams that are provided at the four corners. The center membrane portion has a highly thermally conducting layer and an infrared light absorbing layer, and the edge portions have thermopile elements. In addition, the highly thermally conducting layer is made from a material having excellent infrared light reflectance, such as aluminum or gold.

SUMMARY

In addition, with the infrared light detecting element described in Japanese Patent No. 3339276, the infrared light absorbing layer is at a position that is separated from the infrared sensing part heat-detecting element, and so the heat that is generated in the infrared light absorbing layer cannot be supplied, in some cases, directly to the heat-detecting element infrared light sensing part.

With the infrared light solid-state image capture element described in Japanese Patent Application Republication No. 99/31471, an insulating layer that constitutes an infrared light-absorbing part is in a position that is separated from the temperature detector, and so the heat that is generated in the insulating layer of the infrared light absorbing part, in some cases, cannot be supplied directly to the temperature detector.

In accordance with at least one aspect of the present invention, it is possible to increase the detection sensitivity of a thermal detector.

A thermal detector according to one aspect of the present invention includes a substrate, a support member, a heat-detecting element, a thermal transfer member, a first light-absorbing layer and a second light-absorbing layer. The support member is supported on the substrate so that a cavity is formed between the substrate and the support member. The heat-detecting element is supported on the support member. The thermal transfer member is disposed over the heat-detecting element. The thermal transfer member includes a thermal collecting portion made of a material having light-reflecting characteristics and having a pattern with which a portion of light incident to a region defined by the support member as seen in plan view enters towards the support member, and a connecting portion connecting the thermal collecting portion to the heat-detecting element. The first light-absorbing layer contacts the thermal transfer member and disposed between the thermal transfer member and the support member. The second light-absorbing layer contacts the thermal transfer member and disposed on the thermal transfer member.

The thermal detector of the aspect described above has a first light-absorbing layer, a second light-absorbing layer, a heat-detecting element that is supported on the support member (membrane), and a thermal transfer member that is provided on the heat-detecting element. The thermal transfer member has a thermal collecting portion, and a connecting portion that connects the thermal collecting portion to the heat-detecting element (specifically, for example, to the upper electrode of the heat-detecting element). The thermal transfer member has light-reflecting characteristics with respect to incident light and can be made from a material that has favorable thermal transfer properties. For example, a metal material such as Al may be used. There are various metal materials that have favorable thermal conductivity and light-reflecting characteristics, and materials that have favorable characteristics may be suitably selected in consideration of the manufacture process and the like. Thus, design of the thermal transfer member is easy.

In addition, the thermal collecting portion of the thermal transfer member has a pattern that allows a portion of the light that is incident on the region of the support member, as seen in plan view, to enter the support member. The term "pattern" used herein is to be broadly interpreted as meaning "a planar configuration having a given area." This term is similarly used in subsequent descriptions.

For example, the pattern of the thermal collecting portion can be a cross shape or radial pattern in which multiple extensions extend from the connecting portion towards the outer edges of the support member. In addition, for example, a pattern may be used in which there is provided an annular part that has the shape of a ring (including circular or polygonal rings), as seen in plan view. In addition, for example, a pattern (form) may be used in which a region that is determined by the outer circumference of a closed shape, as seen in plan view, encloses at least one cut-out part (hole part). In addition, for example, a pattern may be used that includes a plurality of isolated patterns. However, the invention is not restricted by these patterns.

When such patterns are used, although the thermal collecting portion composed of a material having light-reflecting characteristics is provided above the heat-detecting element, for example, the entire region of the mounting part of the support member (the region allowing mounting of the heat-detecting element) is not completely covered, as seen in plan view. Instead, only part is covered. Consequently, a portion of incident light will be able to enter into the support member (heat-detecting element) through the region in which the thermal collecting portion is not present.

In addition, a first light-absorbing layer is formed in contact with the thermal transfer member in between the thermal transfer member and the support member, and a second light-absorbing layer is formed in contact with the thermal transfer member on the thermal transfer member.

When the incident light behaves in the manner described above, the generation of heat in the first light-absorbing layer and second light absorbing layer and the transfer of the generated heat to the heat-detecting element, for example, occur in the manner described below. Specifically, a portion of the light that is incident on the thermal detector is absorbed by the second light-absorbing layer and heat is generated in the second light-absorbing layer. In addition, light that has been reflected by the thermal transfer member is absorbed by the second light-absorbing layer and heat is thereby generated by the second light-absorbing layer.

In addition, a portion of the light that has been transmitted by (has passed through) the thermal transfer member is absorbed by the first light-absorbing layer and heat is generated. Moreover, the light that has been reflected at the surface of the support member (interface between the first light-absorbing layer and the support member) is absorbed by at least one of the first light-absorbing layer and the second light-absorbing layer, and heat is thereby generated by the first light-absorbing layer and the second light-absorbing layer.

The heat that has been generated by the second light-absorbing layer is then transferred efficiently through the thermal transfer member to the heat-detecting element, and the heat that has been generated by the first light-absorbing layer is efficiently transferred, either directly or via the thermal transfer member, to the heat-detecting element. When the thermal collecting portion of the thermal transfer member is formed so that it covers a large region of the heat-detecting element, most of the heat that has been generated by the first light-absorbing layer and the second light-absorbing layer can be transferred efficiently to the heat-detecting element, regardless of the site at which it was generated. For example, even heat that has been generated at locations that are distant from the heat-detecting element can be efficiently transferred to the heat-detecting element via the thermal transfer member having high thermal conductivity.

Because the thermal collecting portion of the thermal transfer member and the heat-detecting element are connected by the connecting portion of the thermal transfer member, the heat that is transferred via the thermal collecting portion of the thermal transfer member can be directly transferred to the heat-detecting element via the connecting portion. Moreover, because the heat-detecting element is positioned below the thermal transfer member (provided in an overlapping position as seen in plan view), for example, it is possible to connect the middle part of the thermal transfer member and the heat-detecting element by the shortest possible length, as seen in plan view. Thus, the loss occurring with heat transfer can be decreased, and an increase in footprint can be minimized.

In the thermal detector of this aspect, the heat that has been generated over a large region in the two-layer (multilayer) light-absorbing layer can be efficiently transferred to the heat-detecting element, and thus the light detection sensitivity of a small-size thermal detector can be greatly increased. Moreover, because the time required for transfer of heat is shortened, the response rate of the thermal detector can be increased.

In addition, in this aspect, absorption efficiency is increased because heat is generated by a two-layer light-absorbing film. Moreover, the heat can be directly transferred to the heat-detecting element via the first light-absorbing layer. Thus, in comparison to the infrared light solid-state image capture element described in Japanese Patent Application Republication No. 99/31471 and the infrared light detection element described in Japanese Patent No. 3339276, the detection sensitivity of the thermal detector can be increased. Moreover, in this aspect, the heat-detecting element is connected to the thermal transfer member, and the response rate is thus high, as with the infrared light-detecting element described in Japanese Patent No. 3339276. In this aspect, because the thermal transfer member is directly connected to the heat detecting element, a higher response rate can be obtained in comparison to the infrared light solid state image capture element described in Japanese Patent Application Republication No. 99/31471.

In another aspect of the thermal detector of the present invention, the pattern of the thermal collecting portion of the thermal transfer member preferably has a shape in which a plurality of extension parts extend from the connecting portion towards outer edges of the support member, as seen in plan view.

In accordance with the aspect described above, an appreciably large amount of the light that is incident from above (in other words, from the second light-absorbing layer) can readily pass through to the support member (and thus, for example, a large amount of heat can be generated in the first light-absorbing layer that is close to the heat-detecting element). By increasing the length of the extension parts, even heat that has been generated at sites that are distant from the heat-detecting element, as seen in plan view, can be efficiently collected in the heat-detecting element via the extension parts.

In another aspect of the thermal detector of the present invention, at least one of the extension parts preferably includes one of a curved part that curves with respect to a direction in which the extension part extends from the connecting portion, and a diverging branch part branching off from a linear portion of the extension part.

In this aspect, the curved parts of the diverging branch parts (diverging parts) are also provided on the extension parts. The curved parts extend while curving with respect to the direction of extension, taking the connecting portion as the starting point.

As a result, even heat that has been generated in positions that are distant from the heat-detecting element, as seen in plan view, can be efficiently collected in the heat-detecting element via the curved parts, the diverging branch parts, and the extension parts. In addition, the overall surface area of the thermal collecting portion is increased by providing the curved parts and the diverging branch parts, and the heat that has been generated over a large region can be collected in the heat-detecting element.

In another aspect of the thermal detector of the present invention, the extension parts are preferably arranged symmetrically about a point on the connecting portion as seen in plan view.

According to the aspect described above, the thermal collecting portion has a pattern with point symmetry about the connecting portion as seen in plan view. For example, when the heat-detecting element has a substantially square shape or circular shape as seen in plan view, the connecting portion of the thermal transfer member (the portion that connects the thermal collecting portion to the heat-detecting element) can be provided near the center of the substantially square or circular shape of the heat-detecting element. The pattern of the thermal collecting portion can be a pattern that overlays the basic solid figure when rotated 180° about this connecting portion. In this aspect, the' heat that has been generated at the periphery (in all directions) of the heat-detecting element (or connecting portion) can be efficiently collected in the heat-detecting element with favorable balance.

In another aspect of the thermal detector of the present invention, the pattern of the thermal collecting portion of the thermal transfer member preferably has an annular part encompassing the connecting portion as seen in plan view.

In this aspect, the pattern of the collecting portion may be a pattern having an annular part with a shape that is closed, as seen in plan view. The shape of the annular part may be circular or polygonal (including square-shaped, or the like). In this aspect, the heat that has been generated in the peripheral regions of the heat-detecting element (in particular, the peripheral regions that are separated at a distance from the heat-detecting element), as seen in plan view, can be efficiently collected by the annular part.

In another aspect of the thermal detector of the present invention, the pattern of the thermal collecting portion of the thermal transfer member preferably has a linear part connecting two locations of the annular part with the linear part being disposed inside the annular part as seen in plan view. By connecting the connecting portion to the linear part, heat that has been generated at the peripheral edges can be transferred to the heat-detecting element via the annular part, the linear part, and the connecting portion. In addition, in this aspect, the annular part also functions as a reinforcing member that increases the dynamic strength of the linear part. Thus, for example, bending and deformation of the linear part are effectively prevented. For example, when bending or deformation arises in the linear part, disrupted reflection and the like tends to occur when light is reflected at the surface thereof. The annular part discourages the undesirable situation described above from occurring by restricting bending or deformation of the linear part.

In another aspect of the thermal detector of the present invention, the pattern of the thermal collecting portion of the thermal transfer member preferably has an additional extension part extending from a part of the annular part towards an outside of the annular part as seen in plan view.

According to the aspect described above, extension parts for the annular part are also provided protruding from part of the annular part towards the outside of the annular part. As a result, even heat that has been generated at positions that are even farther from the heat-detecting element can be efficiently collected in the heat-detecting element via the annular part and the extension parts for the annular part. In addition, by providing extension parts for the annular part, the overall surface area of the thermal collecting portion is increased. As a result, heat that has been generated over a greater region can be collected in the heat-detecting element.

In another aspect of the thermal detector of the present invention, the pattern of the thermal collecting portion of the thermal transfer member preferably has a shape in which a region defined by an outer circumference of a closed shape, as seen in plan view, includes at least one cut-out part.

According to the aspect described above, the thermal collecting portion of the thermal transfer member has a shape (pattern) in which a region that is determined by the outer circumference of a closed shape, as seen in plan view, encloses at least one cut-out part. In this aspect, by adjusting the surface area of the region in the thermal collecting portion that reflects light (light-reflecting surface) and the surface area of the cut-out part (hole part), it is possible to determine the ratio of the reflected light and the transmitted light. In addition, by adjusting the shape or position of the cut-out part (hole part), it is possible to suitably define the region where transmission of light to the support member is allowed on the heat-detecting element. As a result, it is comparatively easy to produce a pattern for the thermal collecting portion whereby the heat that has been generated by the first light-absorbing layer or second light-absorbing layer can be efficiently transferred to the heat-detecting element, while also maintaining the degree of freedom related to design.

In another aspect of the thermal detector of the present invention, the pattern of the collecting portion in the thermal transfer member preferably has a plurality of isolated patterns, as seen in plan view, and the connecting portion is provided for each of the isolated patterns.

According to the aspect described above, the thermal collecting portion has a shape that includes a plurality of isolated patterns, as seen in plan view. A connecting portion is provided for each of the isolated patterns, and the heat that is collected by the respective isolated patterns is transferred to the heat-detecting element via the connecting portions. The respective isolated patterns may be the same patterns, or a different pattern may be used for each of the isolated patterns. In this aspect, it is easy to generate a large number of variations on the patterns for the thermal collecting portion of the thermal transfer member. In addition, for example, by using a layout in which isolated patterns are disposed at the periphery (e.g., the four corners) with the connecting portion as the center, the heat that has been generated in the peripheral edge regions in positions that are distant from the thermal heat-detecting element can be efficiently transferred to the heat-detecting element with favorable balance.

In another aspect of the thermal detector of the present invention, the first light-absorbing layer is preferably formed on the support member around the heat-detecting element, and the second light-absorbing layer preferably contacts the support member and the detecting element.

According to the aspect described above, the first light-absorbing layer and the second light-absorbing layer are formed around the heat-detecting element. The second light-absorbing layer is preferably formed completely surrounding the element. As a result, the heat that has been generated over a large region of the first light-absorbing layer and the second light-absorbing layer can be efficiently transferred to the heat-detecting element, either directly or indirectly via the thermal transfer member. As a result, the light detection sensitivity of the thermal detector can be additionally increased. The response rate of the thermal detector can also be increased. The second light-absorbing layer can be in contact with both the heat-detecting element and the support member.

In another embodiment of the thermal detector of the present invention, light of a first wavelength preferably resonates between a surface of the support member on which the heat-detecting element is mounted and an upper surface of the second light-absorbing layer, and light of a second wavelength, which is different from the first wavelength, preferably resonates between a lower surface of the second light-absorbing layer and the upper surface of the second light-absorbing layer.

In this aspect, the film thickness of each of the light-absorbing layers is adjusted so that two optical resonators having different resonating wavelengths are produced. As described above, the first optical resonator for the first wavelength is formed between the surface of the support member and the top surface of the second light-absorbing layer. As described above, the light that has been reflected at the surface of the support member (interface between the first light-absorbing layer and the support member) is absorbed by at least one of the first light-absorbing layer and the second light-absorbing layer, and the effective absorption ratio in the respective light-absorbing layers can be increased, in this case, by providing a first optical resonator.

The first optical resonator, for example, can be a so-called $\lambda/4$ optical resonator. Specifically, taking the first wavelength as $\lambda_1$, it is preferable to adjust the film thicknesses of the first light-absorbing layer and the second light-absorbing layer so that the distance between the surface of the support member on which the heat-detecting element is mounted and the top surface of the second light-absorbing layer (in other words, the total film thickness of the first light-absorbing layer and the second light-absorbing layer) satisfies the relationship: $n \cdot (\lambda_1/4)$ (where n is an integer equal to or greater than 1). As a result, incident light of wavelength $\lambda_1$ and light of wavelength $\lambda_1$ that has been reflected at the surface of the support member are canceled out due to mutual interference, and the effective absorption of the first light-absorbing layer and the second light-absorbing layer will be increased.

Moreover, as described above, the light that has been reflected by the thermal transfer member is absorbed by the second light-absorbing layer, and the effective absorption in the second light-absorbing layer can be increased, in this case, by providing a second optical resonator. For example, a so-called $\lambda/4$ optical resonator may be used as the second optical resonator.

Specifically, taking second wavelength is as $\lambda_2$, the second optical resonator can be constituted by setting the distance between the bottom surface of the second light-absorbing layer and the top surface of the second light-absorbing layer (specifically, the film thickness of the second light-absorbing layer) at $n \cdot (\lambda_2/4)$. As a result, incident light of wavelength $\lambda_2$ and light of wavelength $\lambda_2$ that has been reflected by the bottom surface of the second light-absorbing layer (interface between the first light-absorbing layer and second light-absorbing layer) are canceled out due to mutual interference, thereby increasing the effective absorption at the second light-absorbing layer.

Moreover, in this aspect, because a resonance peak is produced at the two different wavelengths, the wavelength band (wavelength range) of light that can be detected by the thermal detector can be increased.

According to the aspect described above, the collecting portion is preferably provided parallel to the support member. In other words, it is preferable for the primary surface (top surface or bottom surface) of the thermal collecting portion and the primary surface (top surface or bottom surface) of the support member to be disposed in parallel.

A thermal detection device according to another aspect of the present invention includes a plurality of the thermal detectors described in any of the aspects above disposed two-dimensionally.

As a result, a thermal detection device (thermal-type light array sensor) can be produced in which a plurality of the thermal detectors (thermal-type light-detecting elements) are disposed two-dimensionally (e.g., in the form of an array along two perpendicular axes).

An electronic instrument according to another aspect of the present invention comprises the thermal detector described in any of the aspects above and a control part configured to process an output of the thermal detector.

All of the thermal detectors described above have high detection sensitivity, and thus the performance of the electronic instruments that contain these thermal detectors is improved. Examples of electronic instruments include infrared sensor devices, thermographic devices, on-board automotive night-vision cameras, and surveillance cameras.

An electronic instrument according to another aspect of the present invention comprises the thermal detection device described in any of the aspects above and a control part configured to process an output of the thermal detector.

The thermal detection device described above has high detection sensitivity, and thus the performance of the electronic instrument that contains this thermal detection device is improved. Examples of electronic instruments include infrared sensor devices, thermographic devices, on-board automotive night-vision cameras, and surveillance cameras.

A thermal detector manufacturing method according to another aspect of the present invention includes: forming a structure including an insulating layer on a surface of a substrate; forming a sacrificial layer on the structure including the insulating layer; forming a support member on the sacrificial layer; forming a heat-detecting element on the support member; forming a first light-absorbing layer so as to cover the heat-detecting element, and planarizing the first light-absorbing layer; forming a contact hole in a part of the first light-absorbing layer, and subsequently forming a thermal transfer member disposed over the heat-detecting element and made of a material having light-reflective characteristics with respect to light incident on a region of the support member, the thermal transfer member having a thermal collecting portion made of a material having light-reflecting characteristics and having a pattern with which a portion of light incident to a region defined by the support member as seen in plan view enters towards the support member, and a connecting portion connecting the thermal collecting portion to the heat-detecting element; forming a second light-absorbing layer on the first light-absorbing layer; patterning the first light-absorbing layer and the second light-absorbing layer; patterning the support member; and removing the sacrificial layer to form a cavity between the support member and the structure including the insulating layer, which is formed on the surface of the substrate.

In this aspect, a multilayer structure including an interlayer insulating film, a sacrificial layer, and a support member are formed in a layered fashion on the primary surface of the substrate; and a heat-detecting element, a first light-absorbing layer, a thermal transfer member, and a second light-absorbing layer are formed in a layered fashion on the support member. The top surface of the first light-absorbing layer is planarized by a planarization treatment. In addition, a contact hole is provided in the first light-absorbing layer, and a thermal transfer member connecting portion is embedded in this contact hole. The thermal collecting portion for the thermal transfer member that is provided on the first light-absorbing layer is connected to the heat-detecting element (e.g., the top-side electrode of the pyroelectric capacitor) via the connecting portion. In this aspect, a semiconductor fabrication technology (e.g., an MEMS technology) is used in order to realize a thermal detector that is small and has high detection sensitivity.

In accordance with at least one of the aspects of the present invention, for example, it is possible to additionally increase the detection sensitivity of the thermal detector.

BRIEF DESCRIPTION OF THE DRAWINGS

Referring now to the attached drawings which form a part of this original disclosure:

FIGS. 10A and 10B are diagrams showing another example of the pattern of a thermal transfer member.

FIGS. 13A to 13E are diagrams showing the primary steps up to formation of the first light-absorbing layer in a thermal detector manufacturing method.

DETAILED DESCRIPTION OF EXEMPLARY EMBODIMENTS

Preferred embodiments of the present invention are described below. The matter of the present invention described in the claims is not unduly limited by the embodiments described below, and it is not essential for all of the configurations described in the embodiments to be used as means for solving the problems.

Embodiment 1

Figures 1A, 1B:
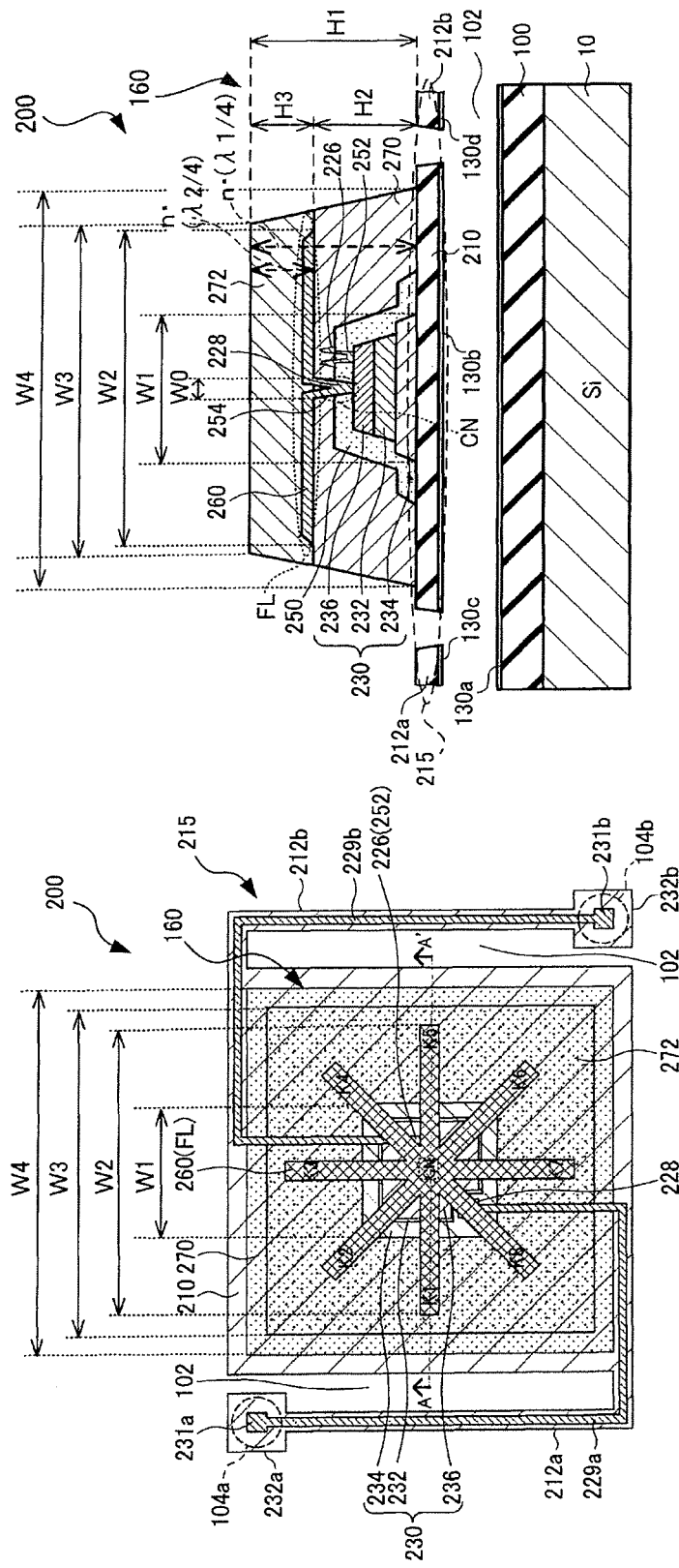
FIGS. 1A and 1B are a plan view and sectional view of an example of a thermal detector.

FIGS. 1A and 1B are plan view and a sectional view of an example of the thermal detector. FIG. 1B is a sectional view of the thermal detector, taken along line A-A' in FIG. 1A. In FIGS. 1A and 1B, an individual thermal detector is shown, but a plurality of thermal detectors may be disposed in the form of a matrix in order to produce the configuration of a thermal detector array (e.g., a thermal-type detection device).

The thermal detector shown in FIGS. 1A and 1B is a pyroelectric infrared detector (a type of light sensor) 200 (however, this is only an example and does not limit the invention). This pyroelectric type infrared photodetector 200 can efficiently transfer the heat that is generated by light absorption in the two-layer light-absorbing films 270 and 272 to the heat-detecting element (here, a pyroelectric capacitor 230) via a thermal transfer member 260 having favorable thermal transfer properties.

The thermal transfer member 260 may be constituted by a material (e.g., a metal such as Al, an alloy, or an alloy compound) that has high thermal conductivity while also reflecting incident light (specifically, light of a wavelength range to which the thermal detector has detection sensitivity). There are various materials that have favorable thermal conductivity and light-reflecting characteristics, and materials with favorable characteristics can be suitably selected in consideration of the manufacture process and the like. Thus, design of the thermal transfer member 260 is easy.

The pyroelectric capacitor 230 that is used as the heat-detecting element converts heat into an electrical signal. As a result, a detection signal (e.g., a current signal) is obtained in accordance with the intensity of the received light, as described in detail below.

Example of Thermal Detector (Pyroelectric Infrared Detector)

The sectional structure will first be described with reference to FIG. 1B.

Sectional Structure of Pyroelectric Infrared Detector

The pyroelectric type infrared detector 200 that is used as the thermal detector is constituted by a multilayer structure that is formed on a substrate (silicon substrate) 10. Specifically, the pyroelectric type infrared light detector that is used as the thermal detector 200 comprises a substrate (in this case, a silicon substrate) 10, a structure 100 including an insulating layer that is formed on the primary surface (in this case, the top surface) of the substrate 10 (e.g., a multilayer structure including an interlayer insulating film; refer to FIG. 6 for details concerning the multilayer structure), an etching stopper film 130a formed on the surface of the structure 100 including the insulating layer, a cavity for thermal isolation (thermal isolation cavity) 102, a support member (membrane) 215 that is constituted by a mounting part 210 and arm parts 212a and 212b, a pyroelectric capacitor 230 used as the heat-detecting element that is formed on the support member (membrane) 215, an insulating layer 250 that covers the surface of the pyroelectric capacitor 230, a first light-absorbing layer (e.g., an $SiO_2$ layer) 270 that is formed between the thermal transfer member 260 and the support member (membrane) 215 and in contact with the thermal transfer member 260 (and thermal collecting portion FL thereof), a thermal transfer member 260 (having a connecting portion CN and a pyroelectric part FL), and a second light-absorbing layer (e.g., an $SiO_2$ layer) 272. The second light-absorbing layer 272 is formed on the thermal transfer member 260 (and the thermal collecting portion FL thereof) and in contact with the thermal transfer member 260 (and the thermal collecting portion FL thereof).

The base part (base) is constituted by the substrate 10 and the multilayer structure 100. This base part (base) supports the element structure 160 that includes the support member 215 and the pyroelectric capacitor 230 in the cavity 102. In addition, a transistor, resistor, or other semiconductor element can be formed, for example, in the region of the silicon (Si) substrate 10 that overlaps with the heat-detecting element (pyroelectric capacitor 230) as seen in plan view (e.g., refer to the example of FIG. 16).

As described above, an etching stopper film (e.g., an $Si_3N_4$ film) 130a is provided on the surface of the multilayer structure 100 that is formed on the substrate 10. In addition, etching stopper films (e.g., $Si_3N_4$ films) 130b to 130d are formed on the back surface of the support member (membrane) 215. The etching stopper films 130a to 130d have the role of preventing removal of layers other than the targets of etching in the step in which the sacrificial layer (not shown in FIG. 1, refer to designation 101 in FIG. 13) is etched in order to form the cavity 102. However, the etching stopper film is not necessary, in some cases, depending on the material that constitutes the support member (membrane) 215.

In addition, the pyroelectric capacitor 230 that is part of the element structure 160 is supported above the cavity 102 by the support member (membrane) 215 which is also part of the element structure 160.

The support member (membrane) 215 can be formed by patterning a three-layer laminate of a silicon oxide film (SiO)/silicon nitride film (SiN)/silicon oxide film (SiO) (this is only an example and does not limit the invention). The support member (membrane) 215 is configured and arranged to stably support the pyroelectric capacitor 230, and thus the total thickness of the support member (membrane) 215 is set to be sufficient to provide the necessary mechanical strength.

An oriented film (not shown in the drawings) is formed on the surface of the support member (membrane) 215, and the pyroelectric capacitor 230 is formed on this oriented film. The pyroelectric capacitor 230 comprises a lower electrode (first electrode) 234, a pyroelectric material layer (e.g., a pyroelectric body PZT layer; lead zirconate titanate layer) 232 that is formed on the lower electrode, and an upper electrode (second electrode) 236 that is formed on the pyroelectric material layer 232.

Each of the lower electrode (first electrode) 234 and the upper electrode (second electrode) 236 can be formed, for example, by laminating three layers of metal film. For example, a three-layer structure may be used in which iridium (Ir), iridium oxide (IrOx) and platinum (Pt) are formed by patterning, for example, in sequence from a location farthest from the pyroelectric material layer (PZT layer) 232. As described above, PZT ($Pb(Zi, Ti)O_3$; lead zirconate titanate) may be used as the pyroelectric material layer 232.

When heat is transferred to the pyroelectric material layer (pyroelectric body), a change in electrical polarity arises in the pyroelectric material layer 232 as a result of the ensuing pyroelectric effect (pyroelectric effect). By detecting the current that accompanies this change in the degree of electrical polarity, it is possible to detect the intensity of the incident light.

This pyroelectric material layer 232 can be formed into a film, for example, by sputtering or MOCVD. The film thickness of the lower electrode (first electrode) 234 and the upper electrode (second electrode) 236 is, for example, about 0.4 μm, and the film thickness of the pyroelectric material layer 232 is, for example, about 0.1 μm.

The pyroelectric capacitor 230 is covered by the insulating layer 250 and the first light-absorbing layer 270. A first contact hole 252 is provided on the insulating layer 250. The first contact hole 252 is used for connecting the electrode 226 of the upper electrode (second electrode) 236 to the upper electrode (second electrode) 236.

The second contact hole 254 is provided in the first light-absorbing layer 270 (and the resistance layer 250). The second contact hole 254 passes through the first light-absorbing layer 270 and the insulating layer 250. This second contact hole 254 is used in order to connect the thermal transfer member 260 to the upper electrode 236 of the pyroelectric capacitor 230. Specifically, the second contact hole 254 (where the filled portion is indicated by the reference designation 228 in the drawing) is filled with the material that constitutes the thermal transfer member 260 (e.g., aluminum or other metal), and, as a result, a connection CN is configured in the thermal transfer member 260.

The pyroelectric capacitor 230 has a thermal collecting portion FL which is the portion that extends over the first light-absorbing layer 270 having a planarized surface and a connecting portion CN which is the portion that is in contact with the upper electrode (second electrode) 236 in the pyroelectric capacitor 230.

The thermal collecting portion FL of the thermal transfer member 260, for example, has the role of collecting the heat that has been generated over a wide region and transferring it to the pyroelectric capacitor 230 that is used as the heat-detecting element. The thermal collecting portion FL, for example, can also be formed in a configuration in which it has a planar surface on the first light-absorbing layer 270 that has been planarized. In this case, the "thermal collecting portion" may also be referred to as a "flat part" or "planar part".

As described above, the thermal transfer member 230, for example, can be constituted by a material (e.g., a metal material) that has high thermal conductivity and has reflective characteristics with respect to incident light. However, it is possible to use a material that is transmissive with respect to at least part of the wavelength range to which the thermal detector has sensitivity, such as aluminum nitride or aluminum oxide. The material for the thermal collecting portion FL and the material 228 for the connecting portion CN (for example, the material of the contact plug that is embedded in the contact hole 254) may be different. In addition, the thermal collecting portion FL in the thermal transfer member 260 has a pattern that allows some of the incident light to enter the support member (membrane) 215, as seen in plan view (this point is described below in reference to FIG. 1A).

In addition, as shown in FIG. 1B, taking the lateral width of the connecting portion CN as W0, taking the lateral width of the pyroelectric capacitor 230 (in this case, the lateral width of the lower electrode (first electrode) 234 having the greatest lateral width) as W1, taking the lateral width of the thermal collecting portion FL of the thermal transfer member 260 as W2, taking the lateral width of the upper surface of the second light-absorbing layer 272 as W3, and taking the lateral width of the lower surface (bottom surface) of the first light-absorbing layer 270 as W4, the relationship W0<W1<W2<W3<W4 obtains.

In addition, the first light-absorbing layer 270 and the second light-absorbing layer 272 are formed on the periphery (preferably around the entire periphery) of the pyroelectric capacitor 230 used as the heat-detecting element which is above the support member (membrane) 215. As a result, the heat that has been generated over a wide region of the first light-absorbing layer and the second light-absorbing layer is efficiently transferred to the heat-detecting element, either directly or indirectly via the thermal transfer member. As a result, the detection sensitivity of the pyroelectric type infrared detector 200 used as the thermal-type detector can be additionally increased. In addition, the response rate of the pyroelectric type infrared detector 200 is additionally improved.

In addition, as shown in FIG. 1B, when the first wavelength is taken as $\lambda_1$, and the second wavelength is taken as $\lambda_2$, the distance H1 between the surface of the support member 215 that carries the pyroelectric capacitor 230 and the upper surface of the second light-absorbing layer 272 (in other words, the total film thickness H1 of the film thickness H2 of the first light-absorbing layer 270 and the film thickness H3 of the second light-absorbing layer 272) is set at $n \cdot (\lambda_1/4)$ (where n is an integer equal to or greater than 1). As a result, a first optical resonator ($\lambda_1/4$ optical resonator) is formed between the surface of the support member (membrane) 215 on which the pyroelectric capacitor 230 is mounted and the upper surface of the second light-absorbing layer 272.

In addition, the distance H3 between the lower surface of the second light-absorbing layer 272 and the upper surface of the second light-absorbing layer 272 (specifically, the film thickness H3 of the second light-absorbing layer 272) is set at $n \cdot (\lambda_2/4)$. As a result, a second optical resonator ($\lambda_2/4$ optical resonator) is constituted between the lower surface of the second light-absorbing layer 272 and the upper surface of the second light-absorbing layer 272. The thermal collecting portion FL of the thermal transfer member 260 in this case is preferably provided parallel to the support member (membrane) 215. In other words, it is preferable for the primary surface of the thermal collecting portion FL (upper or lower surface) and the primary surface of the support member (membrane) 215 (upper or lower surface) to be disposed in parallel. The effects of configuring the first optical resonator and second optical resonator are described below.

Layout Configuration of Pyroelectric Infrared Detector

Next, the layout configuration will be described with reference to FIG. 1A. As shown in FIG. 1A, the support member (membrane) 215 has a mounting part 210 that carries the pyroelectric capacitor 230 and two arms that hold the mounting part 210 over the cavity (thermal isolation cavity) 212, specifically, a first arm 212a and a second arm 212b. The pyroelectric capacitor 230 is formed on the mounting part 210 in the support member (membrane) 215. In addition, as described above, the configuration of the element structure 160 includes the support member (membrane) 215, the pyroelectric capacitor 230, the first light-absorbing layer 270, the thermal transfer member 260, and the second light-absorbing layer 272.

The first arm 212a and the second arm 212b, as described above, can be formed in long thin shapes by processing involving patterning a three-layer laminated film consisting of a silicon oxide film (SiO), a silicon nitride film (SiN), and a silicon oxide film (SiO). The reason that long thin shapes are produced is to increase thermal resistance and to control heat dissipation (heat release) from the pyroelectric capacitor 230.

The wide distal end part 232a of the first arm 212a is supported above the cavity 102 by a first post 104a (circular member as seen in plan view, represented by a broken line in FIG. 1A). In addition, wiring 229a is formed on the first arm part 212a that connects one end (reference symbol 228) to the lower electrode (first electrode) 234 of the pyroelectric capacitor 230 and the other end 231a to the first post 104a.

The first post 104a, for example, is provided between the structure 100 that includes the insulating layer shown in FIG. 1B and the distal end part 232a of the first arm part 212a. This first post 104a is constituted by a multilayer wiring structure that has been processed into a pillar shape that is selectively formed in the cavity 102 (composed of an interlayer insulating layer and a conductive layer that constitutes wiring for connecting the elements such as transistors provided on the underlying silicon substrate 10 with the pyroelectric capacitor 230).

Similarly the second arm part 212b is supported above the cavity 102 by a second post 104b (in FIG. 1A, a circular member as seen in plan view, represented by a broken line). The broad distal end part 232b in the second arm part 212b is supported over the cavity 102 by a second post 104b (in FIG. 1A, a circular member as seen in a plan view, represented by a broken line). In addition, wiring 229b is formed on the second arm part 212b that connects one end (reference symbol 226) to the upper electrode (second electrode) 236 of the pyroelectric capacitor 230 and the other end 231b to the second post 104b.

The second post 104b, for example, is provided between the structure 100 that includes the insulating layer shown in FIG. 1B and the distal end part 232b of the second arm part 212b. This second post 104b is constituted by a multilayer wiring structure that has been processed into a pillar shape selectively in the cavity 102 (composed of an interlayer insulating layer and a conductive layer that constitutes wiring for connecting the elements such as transistors provided on the underlying silicon substrate 10 with the pyroelectric capacitor 230).

In the example shown in FIG. 1A, the first post 104a and the second post 104b are used in order to hold the element structure 160 including the support member 215 and the pyroelectric capacitor 230 in the cavity 102. With this configuration, it is useful if a plural number of pyroelectric capacitors 230 used as heat-detecting elements are disposed at high density in a shared cavity 102 (in other words, when forming a heat-detecting element array). However, this configuration is only an example and does not limit the present invention. For example, in the example shown in FIG. 16, a single space 102 is formed for each of the individual heat-detecting elements 230, and the support member (membrane) 215 may be supported by the structure 100 including the insulating layer surrounding the cavity 102.

In addition, in FIG. 1A, the pyroelectric capacitor 230 is disposed in the middle region of the mounting part 210 in the support member (membrane) 215, and the pyroelectric capacitor 230 has a substantially square shape, as seen in plan view.

In addition, the connecting portion CN of the thermal transfer member 269, as seen in plan view, is positioned at the center of the form of the pyroelectric capacitor (substantially square-shaped). Moreover, as described above, the relationship W0<W1<W2<W3<W4 obtains.

In addition, the thermal collecting portion FL of the thermal transfer member 260, as described above, has a pattern that allows a portion of the incident light to enter the support member (membrane) 215 (including, in addition to the example of FIG. 1A, the pattern examples shown in FIGS. 3 to 12).

In the example of FIG. 1A, a radial pattern is used in which eight extension parts (K1 to K8) are provided that extend from the connecting portion CN towards the outer edges of the support member (membrane) 215. However, this is only an example and does not limit the patterns.

Figure 4A:
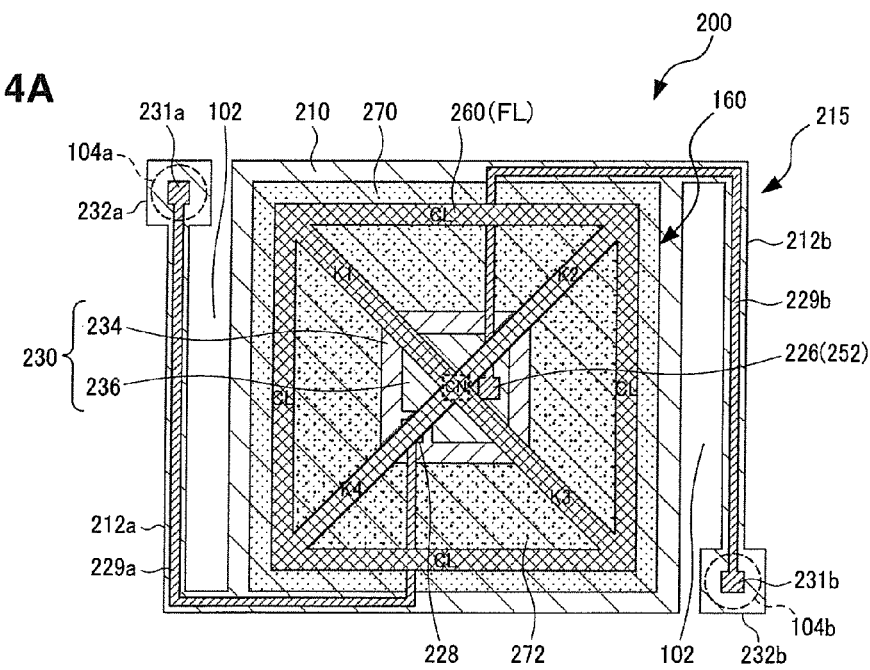
FIGS. 4A and 4B are diagrams showing another example of the pattern of a thermal transfer member.
Figure 4B:
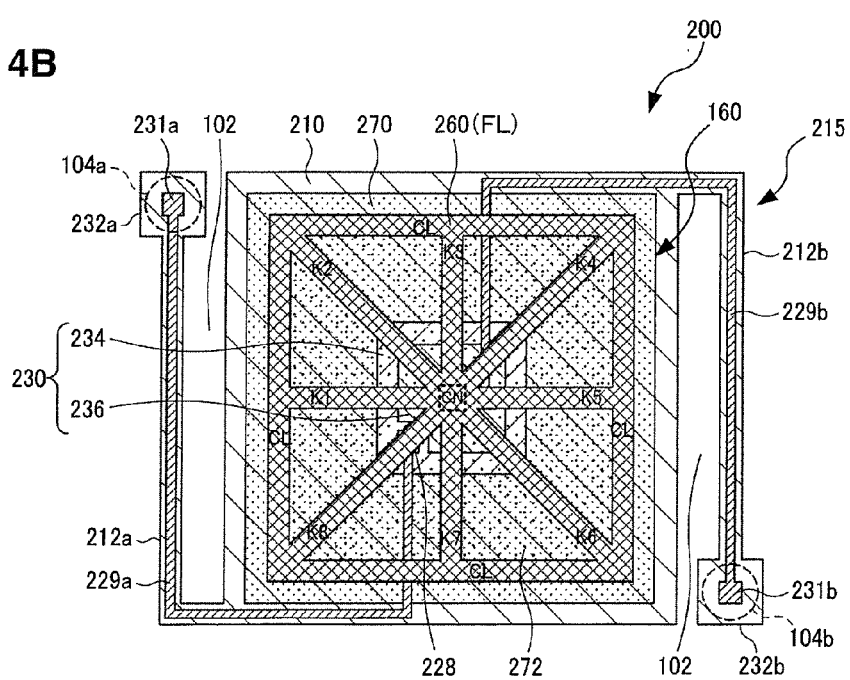
Figure 5A:
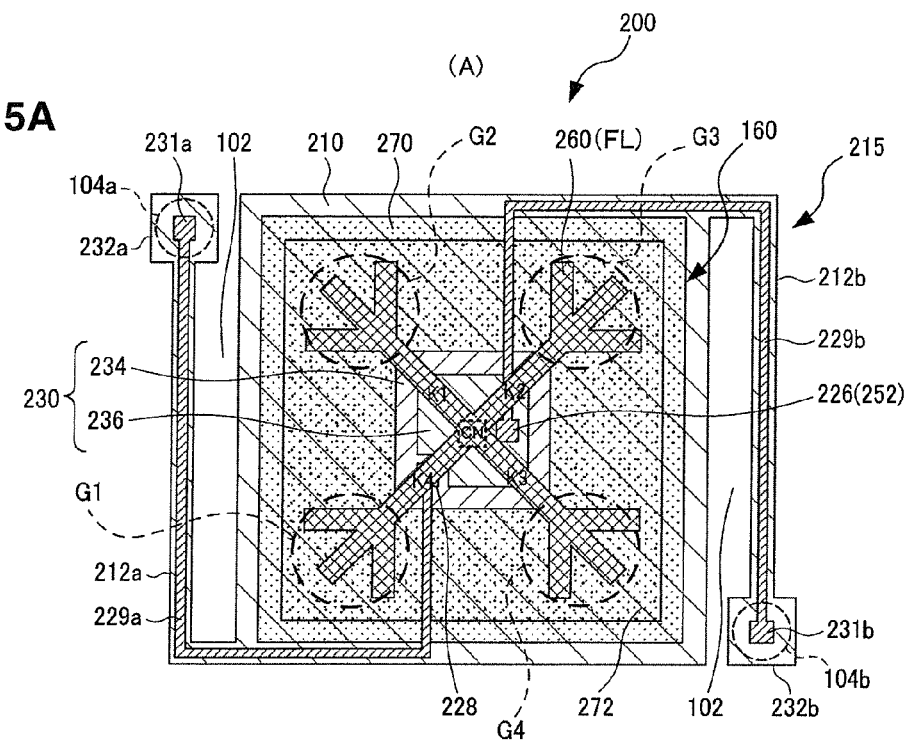
FIGS. 5A and 5B are diagrams showing another example of the pattern of a thermal transfer member.
Figure 5B:
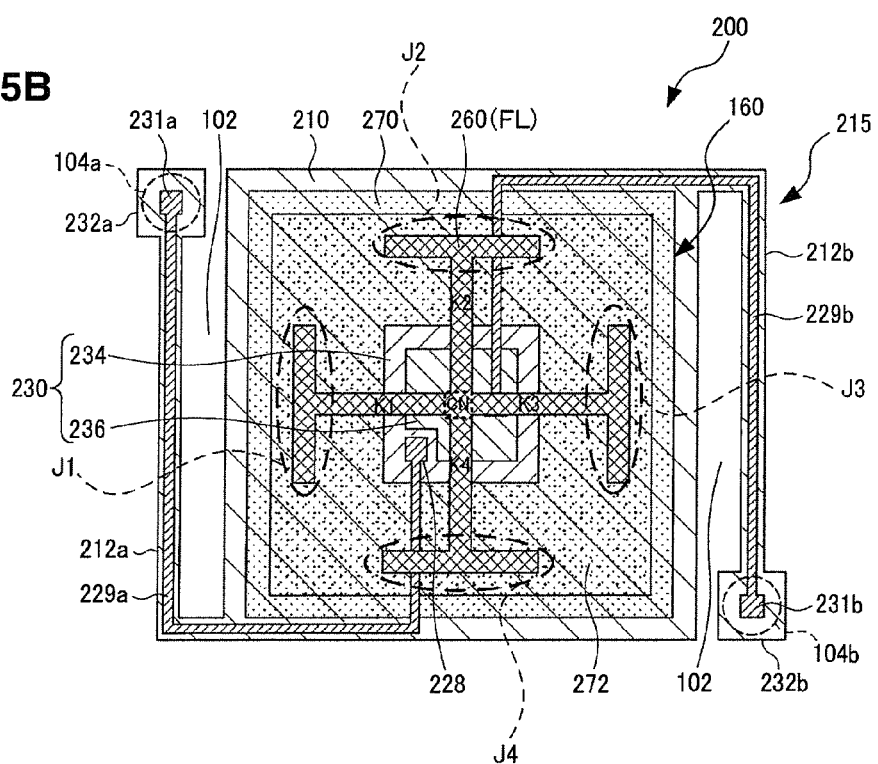

For example, as the pattern for the thermal collecting portion, a cross-shaped pattern may be used in which there are a plurality of extension pats that extend towards the outer edges of the support member (membrane) 215, with the connecting portion CN as the center, as seen in plan view (e.g., refer to the example of FIG. 5B). Alternatively, a pattern may be used in which an annular part is provided that has the shape of a ring (including circles and polygons), as seen in plan view (e.g., refer to the examples of FIGS. 3B, 4, 7, 8B). Moreover, for example, a shape (pattern) may also be used in which at least one cut-out part (hole part, open part, or opening) is enclosed by a region that is determined by the outer circumference of a closed shape, as seen in plan view (e.g., refer to the examples of FIGS. 10 to 12). In addition, a pattern that includes multiple isolated patterns may also be used (e.g., refer to the example of FIG. 9). The characteristic features of each pattern are described below.

By using this type of pattern, even if the thermal collecting portion FL composed of a material having light-reflecting characteristics is provided above the pyroelectric capacitor 230 that is used as the heat-detecting element, for example, as seen in plan view, the entire region of the mounting part (region on which the heat-detecting element can be mounted) on the support member is not completely covered, but rather only partially covered. As a result, a portion of the incident light that is incident on the region of the support member (membrane) 215 can enter the support member (membrane) 215 (which also may be described as the thermal detector element 230) via the region in which the thermal collecting portion FL is not present, as seen in plan view.

A portion of the light that is incident on the pyroelectric type infrared detector 200 is absorbed first by the second light-absorbing layer 272, and heat is generated in the second light-absorbing layer 272. The light that has been reflected by the thermal collecting portion FL of the thermal transfer member 260 is absorbed by the second light-absorbing layer 272 and heat is thereby generated by the second light-absorbing layer 272.

In addition, a portion of the light that has passed through the region in which the thermal collecting portion FL is not present is absorbed by the first light-absorbing layer 270 to generate heat. Moreover, the light that has reflected at the surface of the support member (membrane) 215 (the interface of the first light-absorbing layer 270 and the support member 215) is absorbed by at least one of the first light-absorbing layer 270 and the second light-absorbing layer 272, and heat is thereby generated by the first light-absorbing layer 270 and the second light-absorbing layer 272.

The heat that has been generated by the second light-absorbing layer 272 is efficiently transferred to the pyroelectric capacitor 230 used as the heat-detecting element via the thermal transfer member 260, and the heat that is generated by the first light-absorbing layer 270 is efficiently transferred to the pyroelectric capacitor 230, directly or via the thermal transfer member 260. When the thermal collecting portion FL in the thermal transfer member 260 has a form whereby it covers a broad region of the pyroelectric capacitor 230 (e.g., the example of FIG. 1A), a large amount of the heat that is generated by the first light-absorbing layer 270 and the second light-absorbing layer 272 can be efficiently transferred to the pyroelectric capacitor 230 regardless of the site at which it is generated. Thus, for example, even heat that is generated at locations that are distant from the pyroelectric capacitor 230 can be efficiently transferred to the pyroelectric capacitor 230 via the thermal transfer member 260 having high thermal conductivity.

The thermal collecting portion FL in the thermal transfer member 260 is connected with the pyroelectric capacitor 230 used as the heat-detecting element by the connecting portion CN in the thermal transfer member 260, and the heat that has been transferred via the thermal collecting portion FL of the thermal transfer member 260 can be directly transferred to the pyroelectric capacitor 230 used as the heat-detecting element via the connecting portion CN. In addition, because the pyroelectric capacitor 230 used as the heat-detecting element is positioned under the thermal transfer member 260 (in a superimposed position, as seen in plan view), for example, the middle part of the thermal transfer member 260 as seen in plan view can be connected with the heat-detecting element via the shortest possible distance. Thus, loss accompanying thermal transfer can be reduced, and an increase in dedicated surface area can be suppressed.

In addition, as shown in FIG. 1A, the first light-absorbing layer 270 and the second light-absorbing layer 272 are formed surrounding the pyroelectric capacitor 230 used as the heat-detecting element, which is on the support member (membrane) 215, as seen in plan view. Consequently, heat that is generated over a large region of the first light-absorbing layer 270 and the second light-absorbing layer 272 is efficiently transmitted directly to the pyroelectric capacitor 230, or indirectly via the thermal transfer member 260 which has a surface area that covers a broad area. In other words, heat that is generated over a large region of the first light-absorbing layer 270 and the second light-absorbing layer 272 is collected from any direction (in other words, from every direction) in the pyroelectric capacitor 230. In this case, the pyroelectric capacitor 230 is disposed below the middle of the substantially square-shaped thermal transfer member 260, as seen in plan view. Thus, the heat that is collected via the thermal transfer member 260 from all directions is transferred to the upper electrode (second electrode) 236 of the pyroelectric capacitor 230 through the shortest possible distance via the connecting portion CN. A large amount of heat is thereby efficiently collected from a wide area, and the heat can be transferred to the upper electrode (second electrode) 236 of the pyroelectric capacitor 230 through the shortest possible distance while minimizing loss. Thus, the photodetection sensitivity of the thermal detector 200 can be additionally increased. In addition, the response rate of the thermal detector can be additionally improved.

In this embodiment, the absorption efficiency is increased, because heat is generated by the two light-absorbing layers 270 and 272. The heat can also be directly transferred to the heat-detecting element 230 via the first light-absorbing layer 270. Thus, in comparison to the infrared photodetecting element described in Japanese Patent No. 3339276 and the infrared solid-state image capture element described in Japanese Patent Application Republication No. 99/31471, the detection sensitivity of the thermal detector can be additionally increased. Moreover, in this embodiment, the heat-detecting element 230 is connected to the thermal transfer member 260. Thus, the response rate is as high as the infrared photodetecting element described in Japanese Patent No. 3339276. In this embodiment, because the thermal transfer member 260 is directly connected to the heat-detecting element 230, a higher response rate is obtained relative to the infrared solid-state image capture element described in Japanese Patent Application Republication No. 99/31471.

Operation of Pyroelectric Infrared Detector

The thermal detector 200 according to this embodiment presented in FIGS. 1A and 1B (thermal detector) operates as described below.

For example, the light that is incident on the thermal detector 200, specifically, some of the incident light (e.g., infrared light) that is incident on a region of the support member (membrane) 215 as seen in plan view, is absorbed first by the second light-absorbing layer 272, while the rest reaches the thermal transfer member 260 without being absorbed. The thermal transfer member 260 is transmissive with respect to light, and light is reflected at the thermal collecting portion FL that has a predetermined pattern. On the other hand, light is not reflected in the regions in which the pattern of the thermal collecting portion FL is not provided and enters the support member (membrane) 215. A portion of the light that passes through the thermal transfer member 260 is absorbed by the first light-absorbing layer 270, and the rest reaches the surface of the support member 215 (the interface of the first light-absorbing layer 270 and the mounting part 210 in the support member 215) and the pyroelectric capacitor 230 that is used as the heat-detecting element and is mounted on the support member (membrane) 215.

A large portion of the light that has reached the surface of the support member (membrane) 215 (the interface between the first light-absorbing layer 270 and the mounting part 210 in the support member 215) is reflected by the surface of the support member (membrane) 215. For example, if the first light-absorbing layer 270 is constituted by an SiO$_2$ layer (refractive index 1.45) and the support member (membrane) 215 is constituted by an SiN layer (refractive index 2.0), then, because the refractive index of the first light-absorbing layer 270 is greater than the refractive index of the film that constitutes the support member (membrane) 215 (in other words, the refractive index of the support member 215), most of the light that reaches the support member (membrane) 215 will be reflected at the surface of the support member (membrane) 215.

In addition, it is also effective to provide a metal film such as a titanium (Ti) film as a constituent element of the support member (membrane) 215 (preferably provided on the surface where light is reflected), thereby increasing the light reflectance at the surface of the support member (membrane) 215. The light that is reflected at the surface of the support member (membrane) 215 is absorbed by the first light-absorbing layer 270 or the second light-absorbing layer 272.

When the incident light behaves in the manner described above, the generation of heat in the first light-absorbing layer 270 and the second light-absorbing layer 272 and the transfer of the generated heat to the pyroelectric capacitor 230 used as the heat-detecting element, for example, occurs in the manner described below. Specifically, a portion of the light that is incident on the thermal detector 200 is absorbed by the second light-absorbing layer 272, and heat is generated in the second light-absorbing layer 272. In addition, light that has been reflected by the thermal transfer member 260 is absorbed by the second light-absorbing layer 272, and heat is thereby generated by the second light-absorbing layer 272.

In addition, a portion of the light that has been transmitted by (has passed through) the thermal transfer member 260 is absorbed by the first light-absorbing layer 270, and heat is generated. Moreover, the light that has been reflected at the surface of the support member 215 (interface between the first light-absorbing layer 270 and the mounting part 210 on the support member) is absorbed by at least one of the first light-absorbing layer 270 and the second light-absorbing layer 272, and heat is thereby generated by the first light-absorbing layer 270 and the second light-absorbing layer 272.

The heat that has been generated by the second light-absorbing layer 272 is then transferred efficiently through the thermal transfer member 260 to the pyroelectric capacitor 230 used as the heat-detecting element, and the heat that has been generated by the first light-absorbing layer 270 is efficiently transferred, either directly or via the thermal transfer member 260, to the pyroelectric capacitor 230.

Specifically, the thermal collecting portion FL of the thermal transfer member 260 is formed so as to broadly cover the heat-detecting element (pyroelectric capacitor) 230, and thus most of the heat that is generated by the first light-absorbing layer 270 and the second light-absorbing layer 272 can be transferred efficiently to the heat-detecting element (pyroelectric capacitor) 230, regardless of the site at which it was generated. For example, even heat that has been generated at a location distant from the pyroelectric capacitor 230 can be efficiently transferred to the heat-detecting element (pyroelectric capacitor) 230 via the thermal transfer member 260 having high thermal conductivity.

In addition, because the thermal collecting portion FL of the thermal transfer member 260 and the pyroelectric capacitor 230 are connected by the connecting portion CN of the thermal transfer member 260, the heat that is transmitted via the thermal collecting portion FL of the thermal transfer member 260 can be directly transmitted to the pyroelectric capacitor 230 via the connecting portion CN. Moreover, because the pyroelectric capacitor 230 that is used as the heat-detecting element is positioned under (directly under) the thermal transfer member 260 (provided in positions that are superimposed as seen in plan view), it is possible, for example, to connect the pyroelectric capacitor 230 and the middle part of the thermal transfer member 260 via the shortest possible distance, as seen in plan view. Thus, the loss occurring with heat transfer can be decreased, and an increase in footprint can be minimized.

In this manner, in accordance with the thermal detector described in FIGS. 1A and 1B (in this case a pyroelectric type infrared light detector), the heat that has been generated over a large region in two (a plurality of) light-absorbing layers 270, 272 can be efficiently transferred to the pyroelectric capacitor 230 which is used as the heat-detecting element. Thus, the light detection sensitivity of small-size thermal detectors (pyroelectric type infrared photodetectors) can be greatly increased. Moreover, the time required for light transfer is decreased, and so the response rate of the thermal detector (pyroelectric type infrared photodetector) can be increased.

In addition, with the thermal detector (pyroelectric type infrared photodetector) described in FIGS. 1A and 1B, the first light-absorbing layer 270 and the second light-absorbing layer 272 are formed surrounding the pyroelectric capacitor 230 used as the heat-detecting element as seen in plan view on the support member 215 (or the mounting part 210 thereof). As a result, the heat that is generated over a large region of the first light-absorbing layer 270 and the second light-absorbing layer 272 is extremely efficiently transferred to the pyroelectric capacitor 230 used as the heat-detecting element, either directly or indirectly via the thermal transfer member 260. Thus, the light detection sensitivity of the thermal detector (pyroelectric type infrared photodetector) can be additionally increased, and the response rate of the thermal detector (pyroelectric type infrared photodetector) can be additionally increased.

As described above, with the thermal detector (pyroelectric type infrared photodetector) described in FIGS. 1A and 1B, a first optical resonator for a first wavelength $\lambda_1$ is configured between the upper surface of the second light-absorbing layer 272 and the surface of the support member 215 on which the pyroelectric capacitor 230 is carried, and a second optical resonator for a second wavelength $\lambda_2$ that is different form the first wavelength $\lambda_1$ is configured between the lower surface of the second light-absorbing layer 272 and the upper surface of the second light-absorbing layer 272. Specifically, by adjusting the film thickness of the first light-absorbing layer 270 and the second light-absorbing layer 272, two optical resonators can be configured that have different resonance wavelengths.

As described above, the light that has reflected at the surface of the support member 215 (the interface between the first light-absorbing layer 270 and the mounting part 210 in the support member 215) is absorbed by at least one of the first light-absorbing layer 270 and the second light-absorbing layer 272, and the effective absorption in the respective light-absorbing layers can be increased by configuring a first optical resonator.

The first optical resonator, for example, can be a so-called 2¼ optical resonator. Specifically, taking the first wavelength as it is preferable to adjust the film thicknesses of the first light-absorbing layer 270 and the second light-absorbing layer 272 so that the distance between the surface of the support member 215 on which the pyroelectric capacitor 230 is mounted and the top surface of the second light-absorbing layer 272 (in other words, the total film thickness of the first light-absorbing layer 270 and the second light-absorbing layer 272) satisfies the relationship: $n \cdot (\lambda_1/4)$ (where n is an integer equal to or greater than 1). As a result, incident light of wavelength $\lambda_1$ and light of wavelength $\lambda_1$ that has been reflected at the surface of the support member 215 are canceled out due to mutual interference, and the effective absorption of the first light-absorbing layer 270 and the second light-absorbing layer 272 will be increased.

Moreover, as described above, the light that has been reflected by the thermal transfer member 260 is absorbed by the second light-absorbing layer 272, and the effective absorption in the second light-absorbing layer 272 can be increased, in this case, by providing a second optical resonator. For example, a so-called $\lambda/4$ optical resonator may be used as the second optical resonator.

Specifically, taking the second wavelength as $\lambda_2$, the second optical resonator can be constituted by setting the distance between the bottom surface of the second light-absorbing layer 272 and the top surface of the second light-absorbing layer 272 (specifically, the film thickness of the second light-absorbing layer) at $n \cdot (\lambda_2/4)$. As a result, incident light of wavelength $\lambda_2$ and light of wavelength $\lambda_2$ that has been reflected by the bottom surface of the second light-absorbing layer (interface between the first light-absorbing layer 270 and second light-absorbing layer 272) are canceled out due to mutual interference, thereby increasing the effective absorption at the second light-absorbing layer 272.

Figure 2:
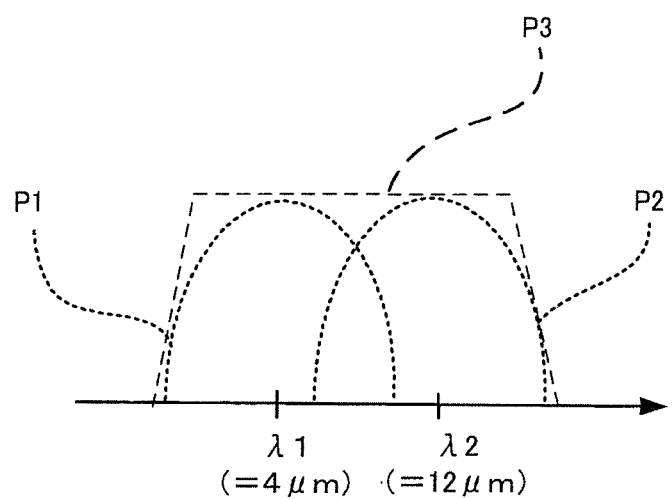
FIG. 2 is a diagram showing an example of the detection sensitivity of the thermal detector having a double optical resonator configuration.

As shown in FIG. 2, the wavelength range in which the thermal detector has detection sensitivity can be increased. FIG. 2 is a diagram showing an example of the detection sensitivity of a thermal detector for a case in which two optical resonators are constituted. In the example shown in FIG. 2, the resonance peak P1 produced by the first optical resonator appears at wavelength $\lambda_1$ (e.g., $\lambda_1=4$ μm), and the resonance peak P2 produced by the second optical resonator appears at wavelength $\lambda_2$ (e.g., $\lambda_2=12$ μm). By synthesizing these peak characteristics, the detection sensitivity P3 of the thermal detector 200 is widened. In other words, a thermal detector 200 that has detection sensitivity over a broad range of wavelengths is realized. Similar effects can be obtained when aluminum nitride (AlN) is used as the material for the thermal transfer member 260.

In this manner, in accordance with the thermal detector of this embodiment, the heat that is generated at locations distant from the heat-detecting element can be efficiently and rapidly collected in the pyroelectric capacitor 230 that is used as the heat-detecting element through the thermal collecting portion FL of the thermal transfer member (thermal transfer layer) 260. In addition, by utilizing interference between light wavelengths (optical resonance), it is possible to increase the effective absorption of light at the first light-absorbing layer 270 and the second light-absorbing layer 272. It is also possible to widen the wavelength range in which the thermal detector has detection sensitivity.

Variations on Thermal Transfer Member

Variations on the pattern of the thermal transfer member 260 will be described below with reference to FIGS. 3 to 12. In FIGS. 3 to 12, the same reference symbols are provided for parts that are common in the drawings above. In FIGS. 3 to 12, the pyroelectric layer 232 that constitutes the pyroelectric capacitor 230 is omitted.

Example of FIG. 3

Figure 3A:
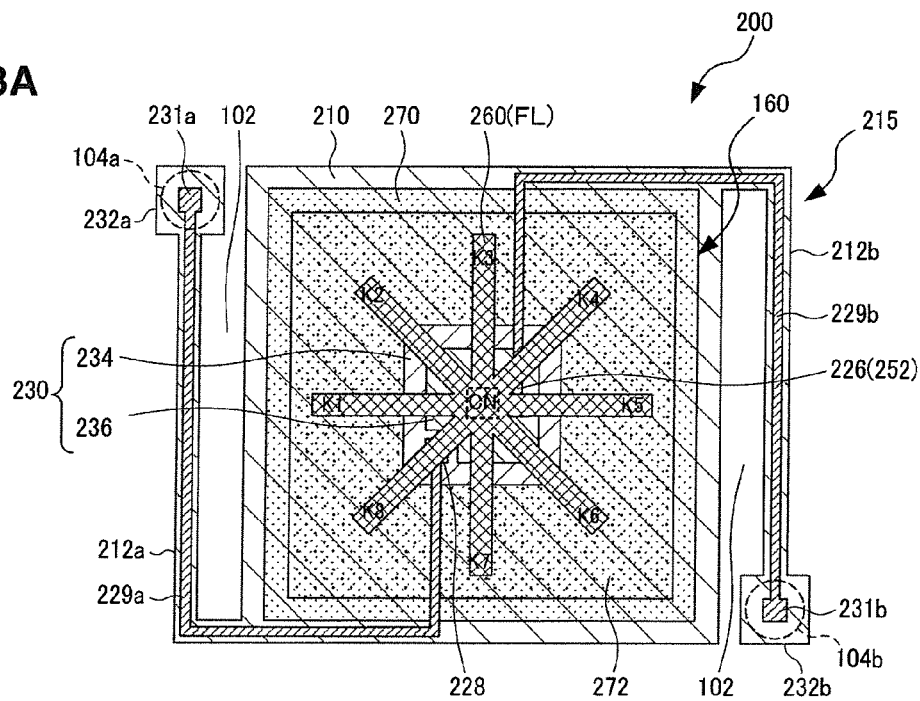
FIGS. 3A and 3B are diagrams showing an example of the pattern of a thermal transfer member.
Figure 3B:
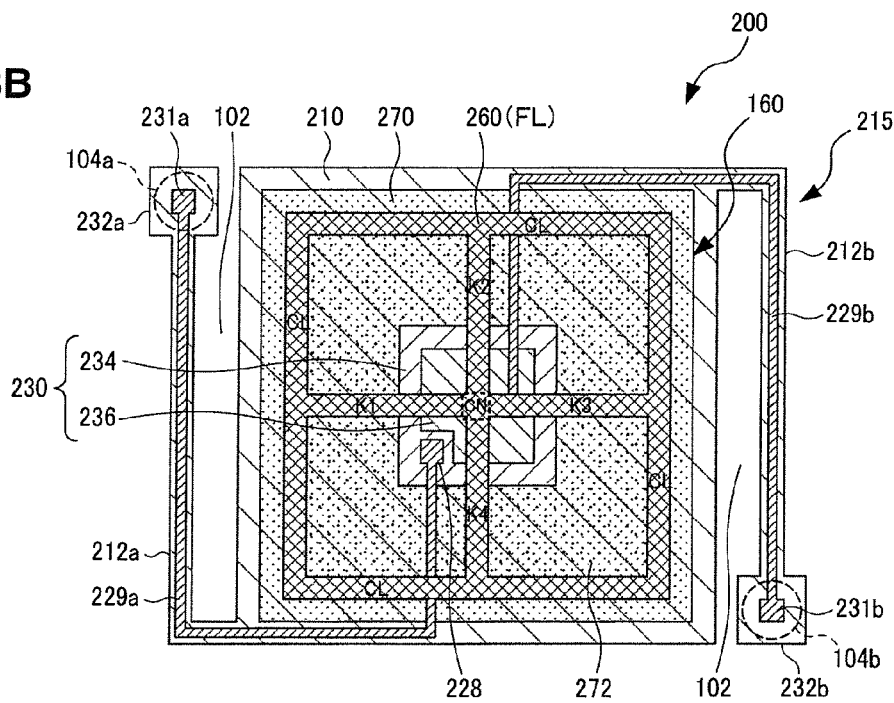

First, in reference to FIG. 3, FIGS. 3A and 3B are diagrams showing an example of the thermal transfer member pattern. The example shown in FIG. 3A is the same as the example shown in FIG. 1A. Specifically, the thermal collecting portion FL of the thermal transfer member 260 has a radiating pattern in which a plurality of extending parts K1 to K8 that extend towards the outer edges (all directions) of the support member (membrane) 215 are provided.

Light-reflective material is not present between the two adjacent extension parts of the extension parts K1 to K8. Consequently, light can enter into the support member (membrane) 215 from this region. Thus, heat is generated by light absorption in the first light-absorbing layer 270 that is situated below the second light-absorbing layer 272. In addition, each of the extension parts K1 to K8 extends past the region in which the pyroelectric capacitor 230 is provided as a thermal-type detection element, as seen in plan view. Thus, even heat that is generated in positions that are distant from the pyroelectric capacitor 230 can be efficiently transferred to the pyroelectric capacitor 230 via the extension parts K1 to K8 in the thermal collecting portion FL.

In accordance with the example of FIG. 3A, a large amount of the light that is incident from above (in other words, on the first light-absorbing layer 270) readily passes through to the support member 215. Thus, for example, a large amount of heat can be generated in the second light-absorbing layer 272 near the pyroelectric capacitor 230 used as a heat-detecting element. In addition, even heat that is generated in positions that are distant from the pyroelectric capacitor 230 used as the heat-detecting element, as seen in plan view, can be efficiently collected in the heat-detecting element via the extension parts by increasing the lengths of the extension parts K1 to K8.

In addition, as shown in FIG. 3A, the shape in which the plurality of extension parts K1 to K8 are provided has point-symmetry about the connecting portion CN, as seen in plan view. In other words, the thermal collecting portion FL of the thermal transfer member 260 has a point-symmetrical pattern about the connecting portion CN, as seen in plan view.

The pyroelectric capacitor 230 used as the heat-detecting element can have a substantially square or circular shape as seen in plan view, and the connecting portion CN of the thermal transfer member 260 can be provided near the center of the substantially square or circular shape of the pyroelectric capacitor 230. The pattern of the thermal collecting portion FL can be a pattern that overlays the basic solid figure when rotated 180° about this connecting portion CN (point-symmetrical pattern). By using a point-symmetrical pattern, the heat that has been generated at the periphery (in all directions) of the pyroelectric capacitor 230 (or connecting portion CN) can be efficiently collected in the pyroelectric capacitor 230 with favorable balance.

In the example shown in FIG. 3B, the thermal collecting portion FL of the thermal transfer member 260 has a pattern that is a combination of an annular pattern and a cross-shaped pattern. Specifically, the thermal collecting portion FL of the thermal transfer member 260 has an annular part CL (in this case, a substantially square-shaped ring part) that is provided so that it connects with the distal end parts of the extension parts K1 to K4 and a cross-shaped pattern in which a plurality of extension parts K1 to K4 are provided extending from the connecting portion CN towards the outer edges (in four directions) of the support member (membrane) 215, with the connecting portion CN as the center, as seen in plan view. This annular part CL is arranged so that it encompasses the connecting portion CN as seen in plan view.

The shape of the annular part CL, for example, includes circles and polygons (including squares). By providing the annular part CL, the heat that has been generated in peripheral regions of the pyroelectric capacitor 230, specifically, peripheral regions that are separated at a distance from the pyroelectric capacitor 230, can be efficiently collected in the pyroelectric capacitor 230 via the annular part CL.

In addition, there are linear parts (straight part comprising K1 and K3, and straight part comprising K2 and K4) that connect part of the annular part CL and other parts in the region inside the annular part CL, as seen in plan view. These linear parts connect to the connecting portion CN of the thermal transfer member 260. Thus heat that is generated in the peripheral edges can be effectively transferred to the pyroelectric capacitor 230 through the annular part CL, the linear parts (K1 and K2, K3 and K4), and the connecting portion CN.

In addition, the annular part CL functions as a reinforcing part that increases the dynamic strength of the linear parts (K1 and K2, K3 and K4). Thus, for example, bending and deformation of the linear parts (K1 and K2, K3 and K4) are effectively prevented. For example, when bending or deformation arises in the linear parts (K1 and K2, K3 and K4), disrupted reflection and the like tends to occur when light is reflected at the surface thereof. The annular part CL discourages the undesirable situation described above from occurring by restricting bending and deformation of the linear part.

Example of FIG. 4

FIGS. 4A and 4B are diagrams showing another example of the pattern of the thermal transfer member. In the examples shown in FIGS. 4A and 4B, as with the example of FIG. 3B described above, the thermal collecting portion FL of the thermal transfer member 260 has a pattern in which there is a combination of an annular pattern CL and a pattern having a plurality of extending parts (K1 to K4, K1 to K8).

However, with the example of FIG. 4A, an X shape is formed by the four extension parts K1 to K4. In addition, in the example of FIG. 4B, a radial shape is formed by the eight extension parts K1 to K8. The resulting effects are similar to those of the examples of FIGS. 3A and 3B.

By changing the number of protruding parts, it is possible to change the ratio of the plan surface area of the thermal collecting portion FL in the thermal transfer member 260 and the surface area of the regions not having the thermal transfer member 260. The annular part CL, as described above, also has the function of increasing the dynamic strength of the linear parts (K1 to K4, K1 to K8) that are disposed in the region inside the annular part CL.

Examples of FIGS. 5 and 6

FIGS. 5A and 5B are diagrams showing another example of the pattern of the thermal transfer member. In the example of FIG. 5A, on the distal ends of the plurality of extension parts K1 to K4 are provided diverging branch parts G1 to G4 that include multiple branch parts (in this case, three branches) that diverge from the distal ends of the respective extension parts K1 to K4. The diverging branch parts are also referred to as diverging parts. The locations where the diverging branch parts G1 to G4 are provided are not restricted to the distal ends of the plurality of extension parts K1 to K4. In addition, although extension parts K1 to K4 are preferably provided for each of the plurality of extension parts K1 to K4, this does not restrict the invention. The diverging branch parts can also be provided on at least one of the plurality of extension parts. In addition, the diverging branch parts G1 to G4 are provided so that they branch from the linear parts of the extension parts K1 to K4.

In the example of FIG. 5B, the plurality of extension parts K1 to K4 have curved parts J1 to J4 (where the curved parts can also be taken as diverging parts that branch in two) that extend while curving with respect to the extension direction of the extension parts K1 to K4, with the connecting portion CN taken as the origin.

By connecting (providing) diverging branch parts G1 to G4 or curved parts J1 to J4 in addition on the distal ends, for example, of the extension parts K1 to K4, even heat that is generated in positions that are distant from the pyroelectric capacitor 230, as seen from a plan view can be efficiently transferred to the pyroelectric capacitor 230 via the diverging branch parts G1 to G4 or the curved parts J1 to J4 along with the extension parts K1 to K4. In addition, by providing the diverging branch parts G1 to G4 and the curved parts J1 to J4, the entire surface area of the thermal collecting portion FL in the thermal transfer member 260 is increased. Thus, the heat that is generated over a broad region can be collected in the pyroelectric capacitor 230.

Figure 6A:
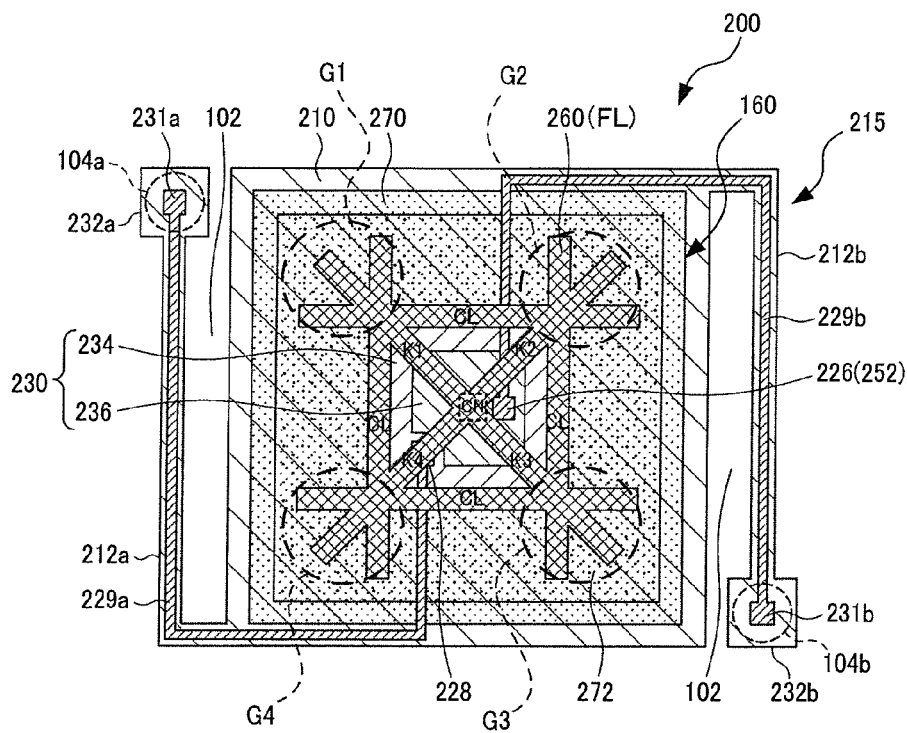
FIGS. 6A and 6B are diagrams showing another example of the pattern of a thermal transfer member.
Figure 6B:
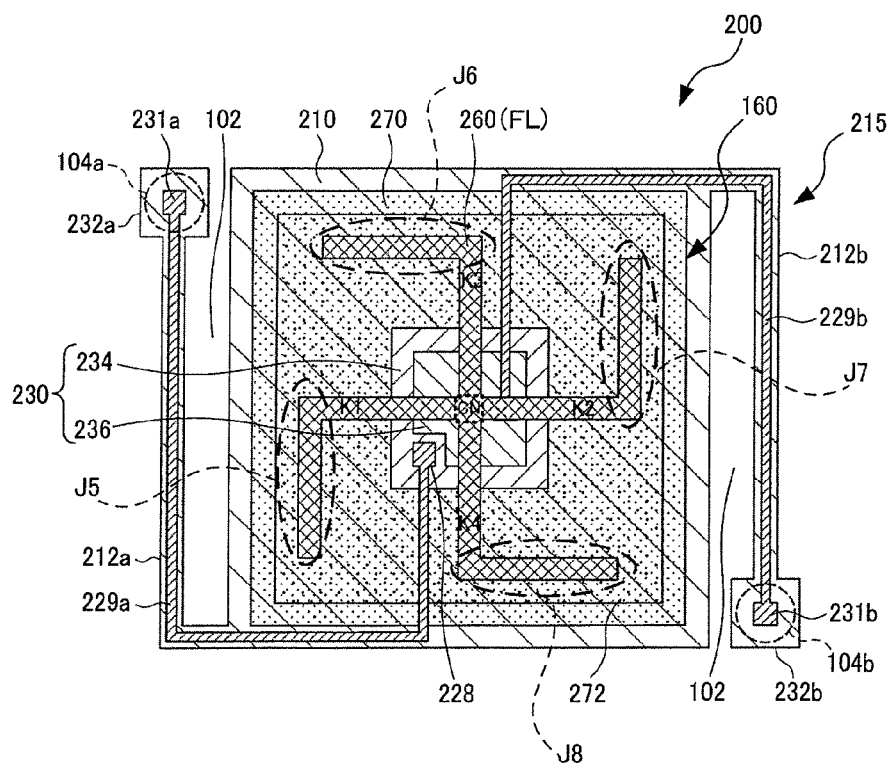

FIGS. 6A and 6B are diagrams showing another example of the pattern of the thermal transfer member. In the example of FIG. 6A, an annular part CL is added to the pattern of the thermal collecting portion FL shown in FIG. 5A. In the example of FIG. 6B, the respective distal ends of the plurality of extension parts K1 to K4 are connected with curved parts J5 to J8 that extend while curving with respect to the direction of extension of the respective extension parts K1 to K4, with the connecting portion CN as the starting point (where this configuration is an example and does not restrict the present invention). The resulting effects are similar to those of the examples of FIGS. 5A and 5B.

Example of FIG. 7

Figure 7A:
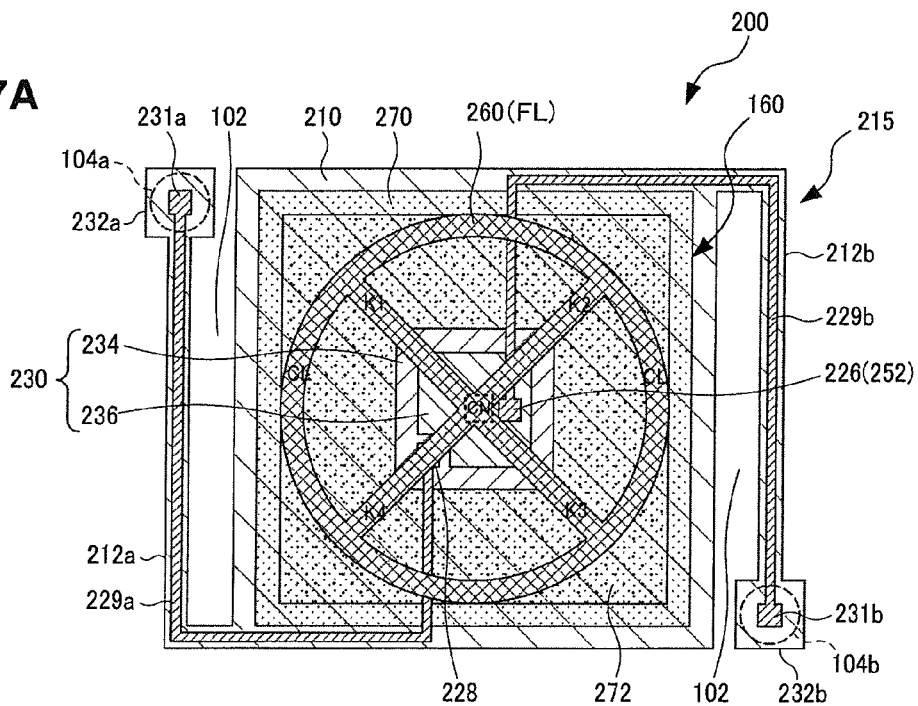
FIGS. 7A and 7B are diagrams showing another example of the pattern of a thermal transfer member.
Figure 7B:
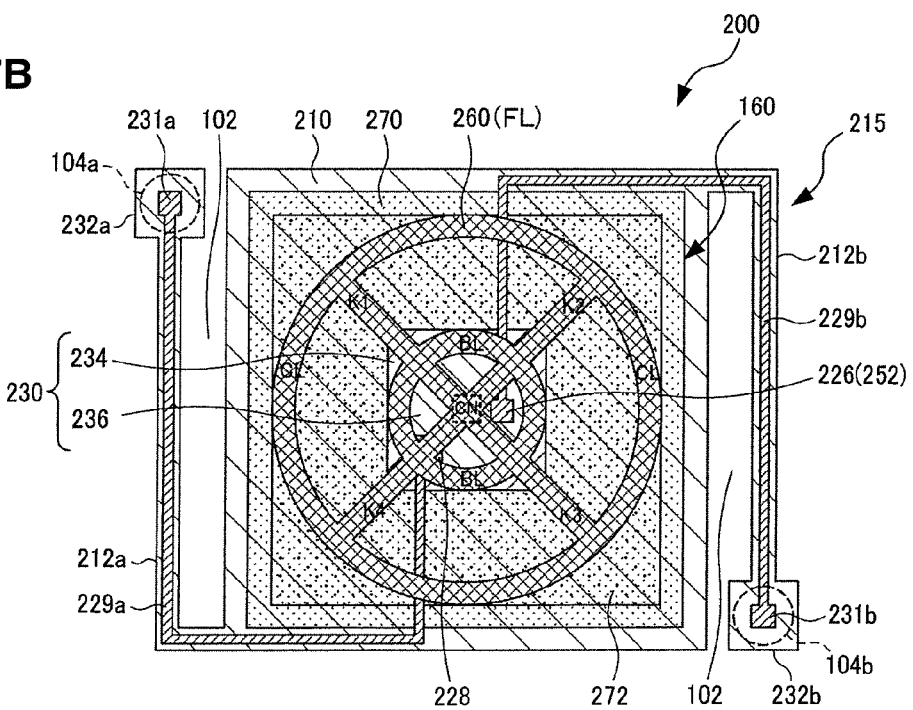

FIGS. 7A and 7B are diagrams showing another example of the thermal transfer member pattern. In the example of FIG. 7A, a pattern is used in which a square annular part CL, as seen in plan view, is substituted for the circular annular part CL, as seen in plan view, in the example of FIG. 4A. In the example of FIG. 7B, a pattern is used in which an inner annular part BL is added to the pattern in the sample of FIG. 7A. The resulting effects are similar to the examples listed above.

Example of FIG. 8

Figure 8A:
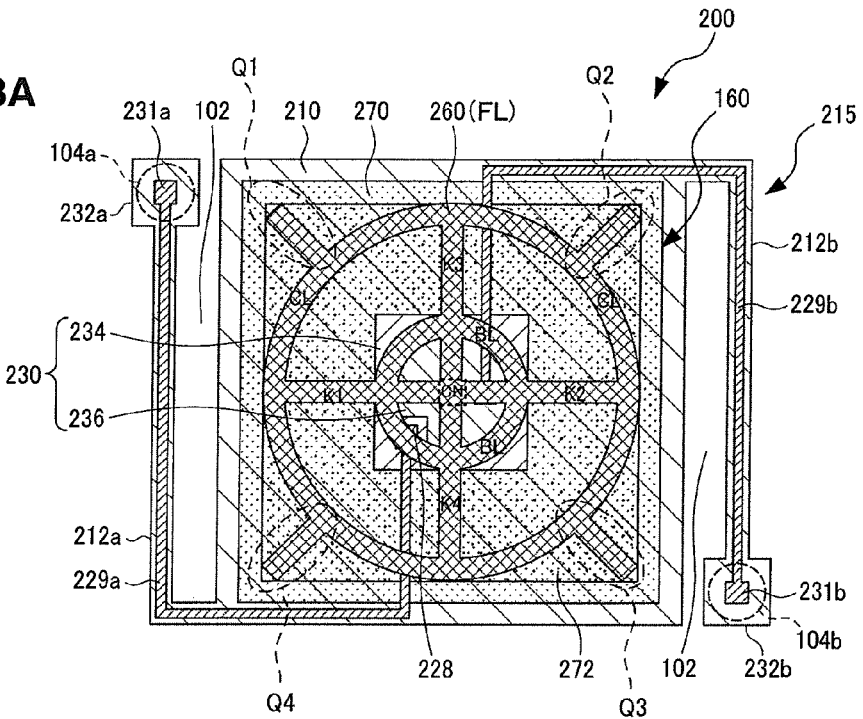
FIGS. 8A and 8B are diagrams showing another example of the pattern of a thermal transfer member.
Figure 8B:
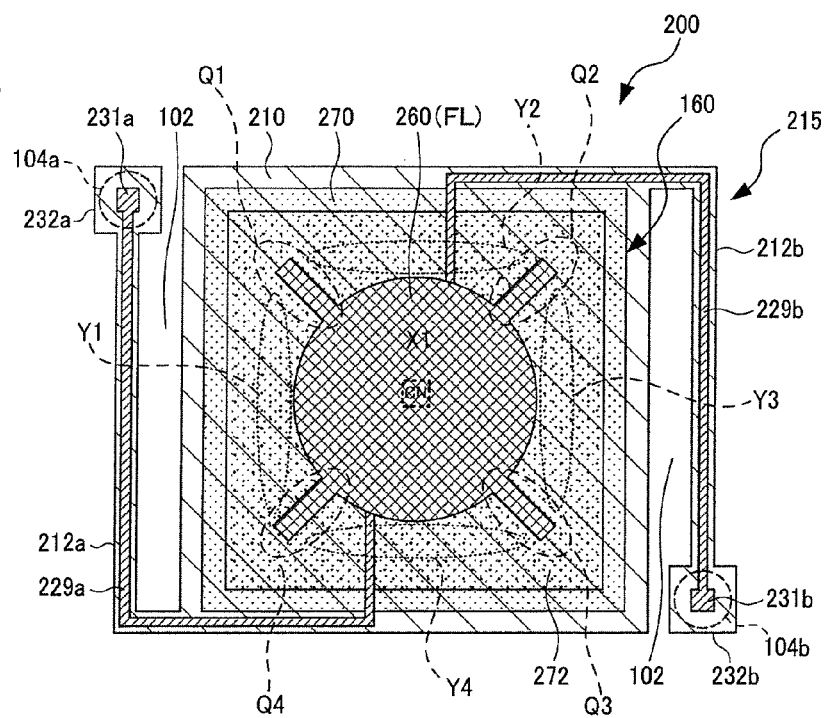

FIGS. 8A and 8B are diagrams showing additional examples of the thermal transfer member pattern. In the example of FIG. 8A, ring extension parts Q1 to Q4 for the annular part are provided that extend from part of the annular part CL, as seen in plan view, towards the outer edges of the support member (membrane) 215. As a result, even heat that has been generated in positions that are distant from the pyroelectric capacitor 230 can be efficiently collected in the pyroelectric capacitor 230 via the extension parts Q1 to Q4 for the annular part, the annular part CL, and the four extension parts K1 to K4 (and also the inner annular part BL). In addition, by providing the extension parts Q1 to Q4 for the annular part, the overall surface area of the thermal collecting portion FL is increased. As a result, the heat that is generated over a wide region can be collected in the pyroelectric capacitor 230.

FIG. 8B is a modification of the example in which the extension parts Q1 to Q4 for the annular part are provided. In the example of FIG. 8B, the thermal collecting portion FL of the thermal transfer member 260 has a circular light-reflecting surface X1 having a comparatively small surface area.

The light-reflecting surface X1 can be seen as an annular part, broadly defined, insofar as it has a shape with a closed external perimeter. In the example of FIG. 8, extension parts Q1 to Q4 for the annular part connect with the light-reflecting surface X1 which can be taken as the annular part, broadly defined. Because the light-reflecting surface X1 has a small surface area, regions Y1 to Y4 are present in peripheral regions thereof through which incident light passes, and a portion of the incident light can enter into the support member (membrane) 215 via these regions Y1 to Y4.

By providing extension parts Q1 to Q4 for the annular part, even heat that is generated in positions that are distant from the pyroelectric capacitor 230 can be focused in the pyroelectric capacitor 230. In addition, by providing the extension parts Q1 to Q4 for the annular part, the overall surface area of the thermal collecting portion FL can be increased.

Example of FIG. 9

Figure 9A:
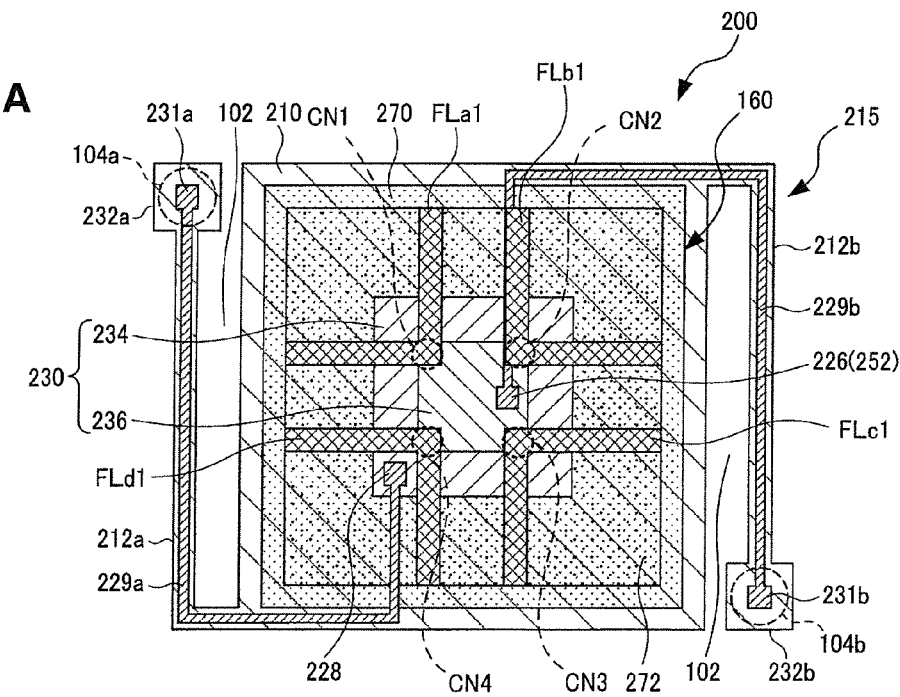
FIGS. 9A and 9B are diagrams showing another example of the pattern of a thermal transfer member.
Figure 9B:
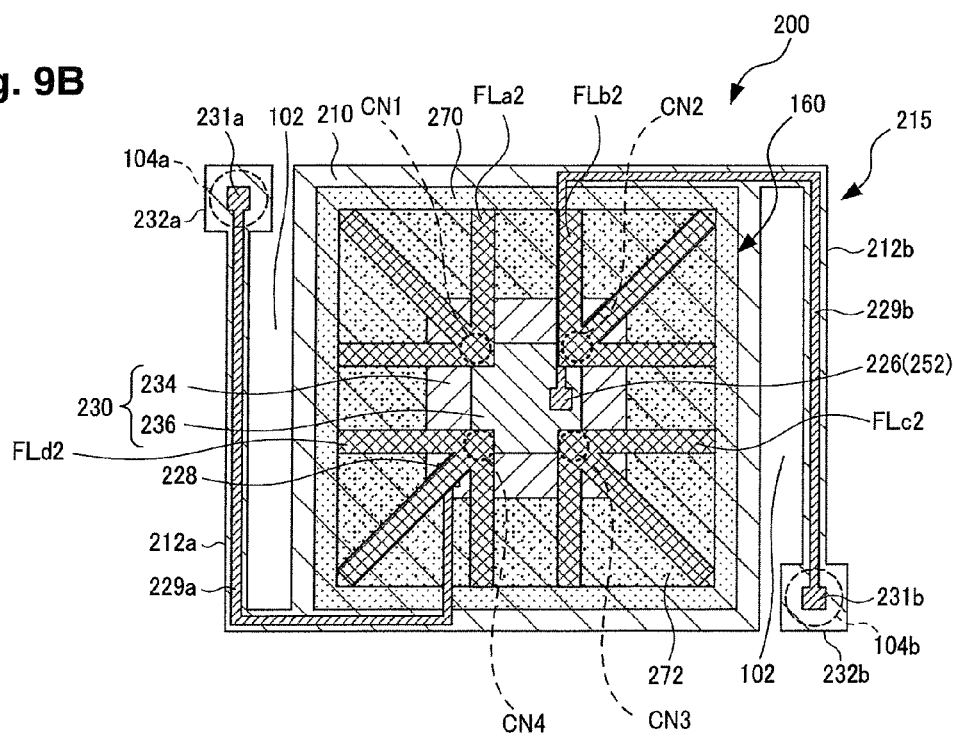

FIGS. 9A and 9B are diagrams showing another example of the pattern of the thermal transfer member. In the examples shown in FIGS. 9A and 9B, a plurality of isolated patterns and a pattern having a connecting portion that is provided for each of the isolated patterns, as seen in plan view, is used for the pattern of the thermal collecting portion FL in the thermal transfer member 260.

In the example of FIG. 9A, the thermal collecting portion FL has four isolated patterns FLa1, FLb1, FLc1, and FLd1. Each of the four isolated patterns FLa1, FLb1, FLc1, and FLd1 has patterns with two mutually perpendicular branch parts that branch in two from each of the connecting portions CN1 to CN4.

The connecting portion CN1 is provided for the isolated pattern FLa1. The isolated pattern FLa1 is connected to the upper electrode (second electrode) 236 of the pyroelectric capacitor 230 via the connecting portion CN1. Similarly, the connecting portion CN2 is provided for the isolated pattern FLb1. The isolated pattern FLb1 is connected to the upper electrode (second electrode) 236 of the pyroelectric capacitor 230 via the connecting portion CN2. In addition, the connecting portion CN3 is provided for the isolated pattern FLc1. The isolated pattern FLc1 is connected to the upper electrode (second electrode) 236 of the pyroelectric capacitor 230 via the connecting portion CN3. In addition, the connecting portion CN4 is provided for the isolated pattern FLd1. The isolated pattern FLd1 is connected to the upper electrode (second electrode) 236 of the pyroelectric capacitor 230 via the connecting portion CN4.

In addition, in the example of FIG. 9B, the thermal collecting portion FL has four isolated patterns FLa2, FLb2, FLc2, and FLd2.

In the example of FIG. 9B, the thermal collecting portion FL has four isolated patterns FLa1, FLb2, FLc2, and FLd2. Each of the four isolated patterns FLa2, FLb2, FLc2, and FLd2 has a pattern having three branches that diverge from each of the connecting portions CN1 to CN4.

The connecting portion CN1 is provided for the isolated pattern FLa2. The isolated pattern FLa2 is connected to the upper electrode (second electrode) 236 of the pyroelectric capacitor 230 via the connecting portion CN1. Similarly, the connecting portion CN2 is provided for the isolated pattern FLb2. The isolated pattern FLb2 is connected to the upper electrode (second electrode) 236 of the pyroelectric capacitor 230 via the connecting portion CN2. In addition, the connecting portion CN3 is provided for the isolated pattern FLc2. The isolated pattern FLc2 is connected to the upper electrode (second electrode) 236 of the pyroelectric capacitor 230 via the connecting portion CN3. In addition, the connecting portion CN4 is provided for the isolated pattern FLd2. The isolated pattern FLd2 is connected to the upper electrode (second electrode) 236 of the pyroelectric capacitor 230 via the connecting portion CN4.

In this manner, in the examples of FIGS. 9A and 9B, connecting portions (C1 to C4) are provided for each of the isolated patterns (FLa1 to FLd1, FLa2 to FLd2), and the heat that is collected by the respective isolated patterns is transferred to the pyroelectric capacitor 230 via the respective connecting portions. Each of the isolated patterns may be a shared pattern, or different patterns may be used for each isolated pattern. In the Examples of FIGS. 9A and 9B, it is easy to provide a wealth of variations in the patterns for the thermal collecting portion FL in the thermal transfer member 260.

In addition, if a layout is used in which isolated patterns are arranged in the peripheral region (e.g., at the four corners) centering on the connecting portions (CN1 to CN4) (the layout shown in FIGS. 9A and 9B), then the heat that is generated in the peripheral edge region in positions that are distant from the pyroelectric capacitor 230 can be efficiently transferred to the pyroelectric capacitor 230 with favorable balance.

Examples of FIGS. 10 to 12

In the examples of FIGS. 10 to 12, a shape (pattern) is used for the pattern of the thermal collecting portion FL in the thermal transfer member 260 in which a region that is determined by the outer circumference of a closed shape, as seen in plan view, encloses at least one cut-out part. In this example, by adjusting the surface area of the region in the thermal collecting portion FL that reflects light (light-reflecting surface) and the surface area of the cut-out part (hole part), it is possible to determine the ratio of the reflected light and the transmitted light.

FIGS. 10A and 10B are diagrams showing another example of the pattern of the thermal transfer member. In the example of FIG. 10A, four substantially square-shaped cut-out parts Y5 to Y8 are provided along each of the four edges of the pyroelectric capacitor 230 in the substantially square-shaped light-reflecting surface X2, as seen from a plan view. In addition, in the example shown in FIG. 10B, four substantially square-shaped cut-out parts Y9 to Y11 are provided at the four corners of the pyroelectric capacitor 230 in the light-reflecting surface X2, as seen in plan view.

Figure 11A:
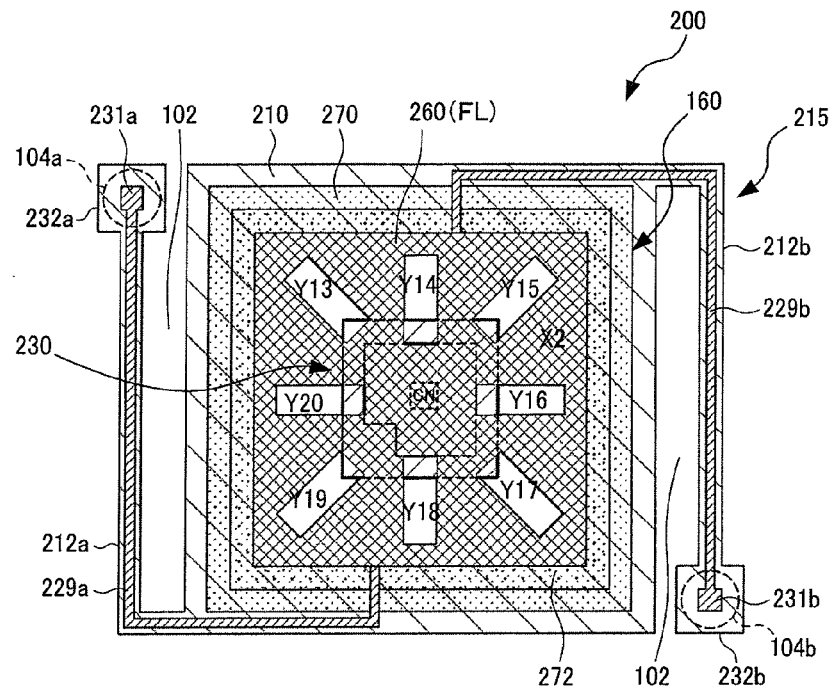
FIGS. 11A and 11B are diagrams showing another example of the pattern of a thermal transfer member.
Figure 11B:
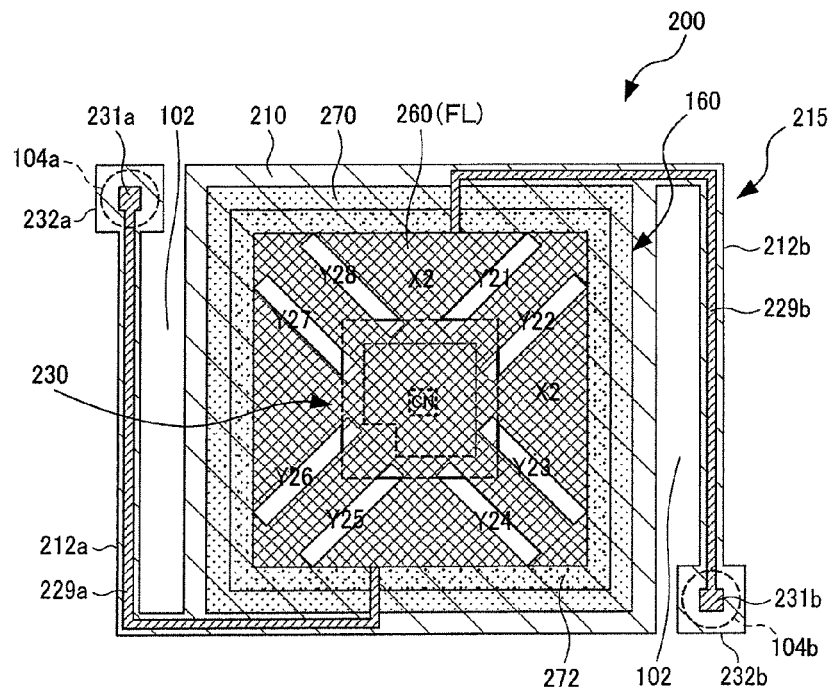

FIGS. 11A and 11B are diagrams showing another example of the pattern of the thermal transfer member. In the example of FIG. 11A, eight substantially square-shaped cut-out parts Y13 to Y20 are provided at the four corners and along the four edges of the pyroelectric capacitor 230 in the light-reflecting surface X2, as seen in plan view. In addition, in the example of FIG. 11B, eight substantially rectangular cut-out parts Y21 to Y28 are provided in the four corners of the pyroelectric capacitor 230 in the light-reflecting surface X2, as seen in plan view.

Figure 12A:
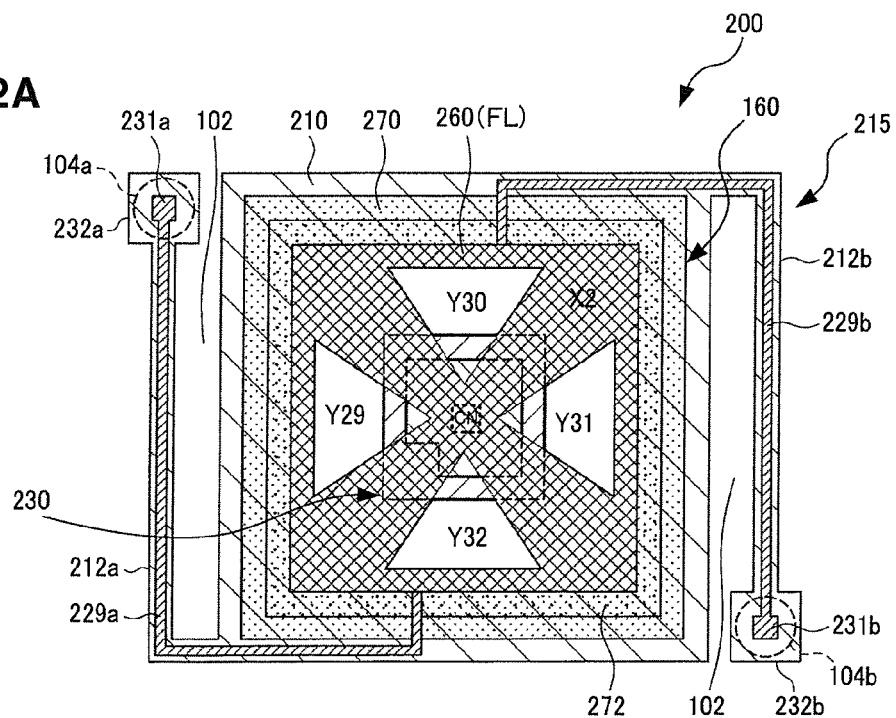
FIGS. 12A and 12B are diagrams showing another example of the pattern of a thermal transfer member.
Figure 12B:
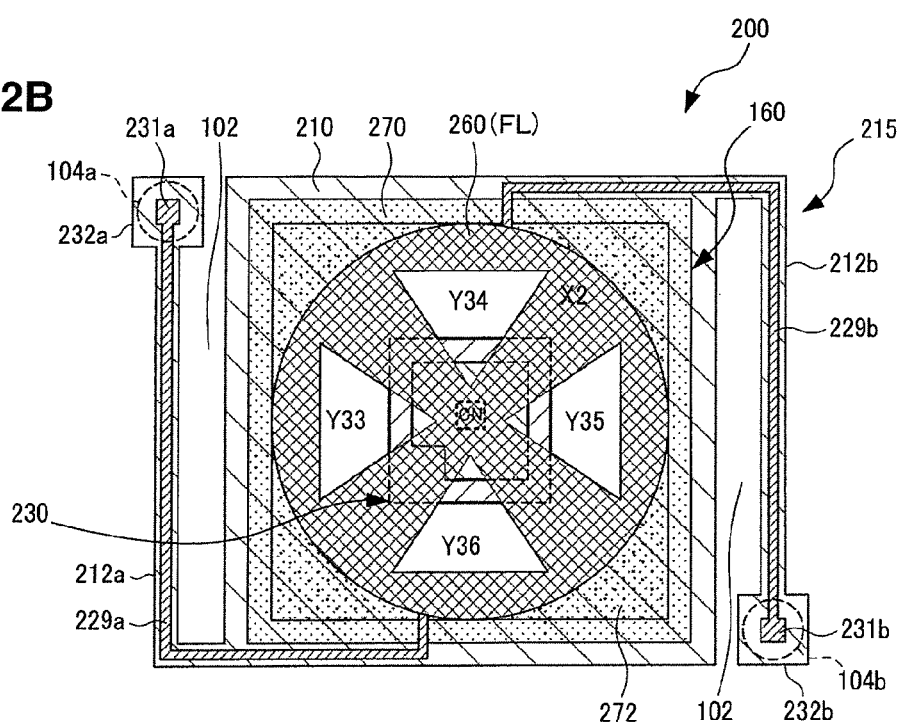

FIG. 12A and FIG. 12B are diagrams that show another example of the pattern of the thermal-transfer member. In the example of FIG. 12A, four triangular cut-out parts Y29 to Y32 are provided along the four edges of the pyroelectric capacitor 230 in the substantially square-shaped light-reflecting surface X2, as seen in plan view. In addition, in the example of FIG. 12B, four triangular cut-out parts Y33 to Y36 are provided at the four corners of the pyroelectric capacitor 230 in the circular light-reflecting surface X2, as seen in plan view.

In the examples of FIGS. 10 to 12, by adjusting the ratio of the surface area of the region that reflects light in the thermal collecting portion FL (specifically, the light-reflecting surface X2 or X3), and the surface area of the cut-out parts (Y5 to Y36), it is possible to determine the ratio of the reflected light (incident light is reflected by the light-reflecting surface) and the transmitted light (light that passes through the cut-out parts). In addition, by adjusting the shapes or positions of the cut-out parts (Y5 to Y36), it is possible to appropriately establish the region on the pyroelectric capacitor 230 that allows incident light to enter the support member 215. As a result, it is comparatively easy to produce a pattern for the thermal collecting portion FL whereby the heat that has been generated by the first light-absorbing layer 270 or second light-absorbing layer 272 can be efficiently transferred to the heat-detecting element 230, while a favorable degree of design freedom can be maintained.

Embodiment 2

The thermal detector manufacturing method of this embodiment is described below with reference to FIGS. 13 to 15. First, FIGS. 13A to 13E will be discussed. FIGS. 13A to 13E are diagrams that show the main steps of the thermal detector manufacturing method up until formation of the first light-absorbing layer.

In the step shown in FIG. 13A, a silicon substrate (which may have elements such as transistors) is prepared, and a structure 100 including an insulating layer (e.g., a multilayer wiring structure) is formed on the silicon substrate 10. An etching stopper film 130a is then formed on the structure 100 including the insulating layer, and a sacrificial layer (e.g., an SiO₂ layer) 101 is then formed.

In the step of FIG. 13B, an etching stopper film 130b is formed on the sacrificial layer 101. Next, a thick film that will serve as the support member (membrane) 215 (e.g., a thick film composed of a three-layer laminated film) is formed.

In the step of FIG. 13C, a lower electrode (first electrode) 234, a pyroelectric material layer (PZT layer) 232, and an upper electrode (second electrode) 236 are layered on the support member (membrane) 215 to form the pyroelectric capacitor 230 that is used as the heat-detecting element. The method for forming the pyroelectric capacitor 230, for example, can be an atomic layer CVD method. Next, the insulating layer 250 is formed so that it covers the pyroelectric capacitor 230. The insulating layer 250 can be formed, for example, by a CVD method. Next, the insulating layer 250 is patterned.

In the step of FIG. 13D, the first contact hole 252 is formed in the insulating layer 250 that covers the pyroelectric capacitor 230, and a metal material layer is then deposited, whereupon the metal material layer is patterned in order to form the electrode (and wiring) 226 that connects with the upper electrode (second electrode) 236. In the step of FIG. 13D, wiring (not shown in) and an electrode that connects to the lower electrode (first electrode) are formed together.

In the step of FIG. 13E, the first light-absorbing layer (e.g., SiO₂ layer) 270 is formed by a CVD method. Next, this surface is planarized by, for example, chemical mechanical polishing (CMP).

Figure 14A:
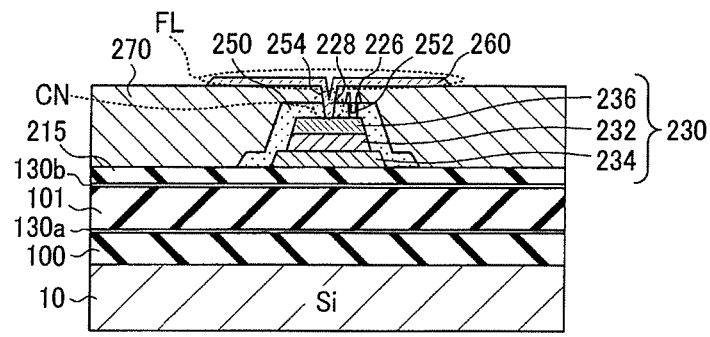
FIGS. 14A to 14C are diagrams showing the primary steps up to patterning the first light-absorbing layer and the second light-absorbing layer in a thermal detector manufacturing method.
Figure 14B:
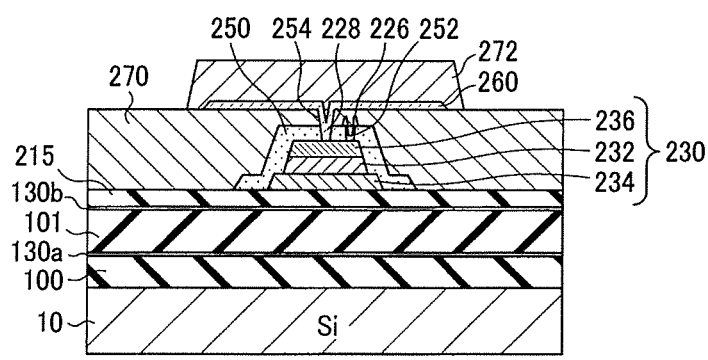
Figure 14C:
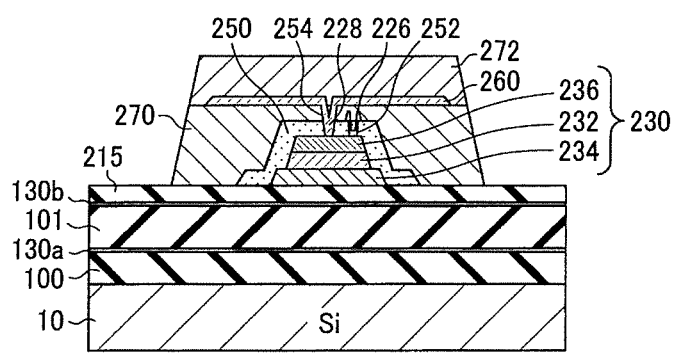

FIGS. 14A to 14C are referred to below. FIGS. 14A to 14C are diagrams that show the steps up to patterning the first light-absorbing layer and the second light-absorbing layer in the method for producing the thermal detector. In the step of FIG. 14A, the second contact hole 254 is formed in the first light-absorbing layer 270. Next, a material having high thermal conductivity and, for example, light transmissivity, such as aluminum oxide (alumina; AlO$_x$) or aluminum nitride (AlN), is deposited and patterned to form the thermal transfer member (thermal transfer layer) 260. The thermal transfer member 260 has a thermal collecting portion FL and a connecting portion CN. The interior of the second contact hole 254 is filled with a material such as alumina. The connecting portion CN is constituted by the portion 238 that is filled with the material such as alumina.

In the step of FIG. 14B, a material layer that will form the second light-absorbing layer (e.g., SiO₂ layer) is deposited and patterned on the first light-absorbing layer 270. As a result, the second light-absorbing layer 272 is formed. In the step of FIG. 14C, the first light-absorbing layer 270 is patterned.

Figure 15A:
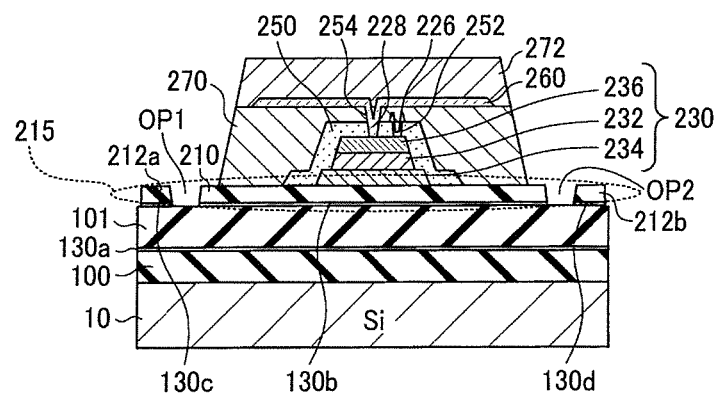
FIGS. 15A and 15B are diagrams showing the primary steps for completion of the thermal detector in the thermal detector manufacturing method.
Figure 15B:
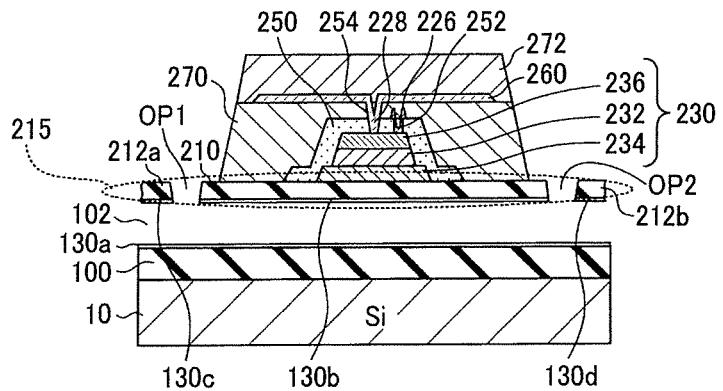

FIGS. 15A and 15B are referred to below. FIGS. 15A and 15B are diagrams that show the steps up to completion of the thermal detector in the thermal detector manufacturing method. In the step of FIG. 15A, the support member (membrane) 215 is patterned. As a result, the mounting part 210, the first arm part 212a, and the second arm part 212b are formed. In FIG. 15A, the reference symbol OP is used for the portions that are removed by patterning (openings).

In the step of FIG. 15B, the sacrificial layer 101 is selectively removed by, for example, wet etching. As a result, the cavity (thermal isolation cavity) 102 is formed. The mounting part 210 of the support member 215 is separated from the base part (substrate 10, structure 100 including insulating layer, and etching stopper film 130a) by the cavity 102. Consequently, release of heat through the support member 215 is inhibited. The thermal detector is completed in this manner.

Embodiment 3

Figure 16:
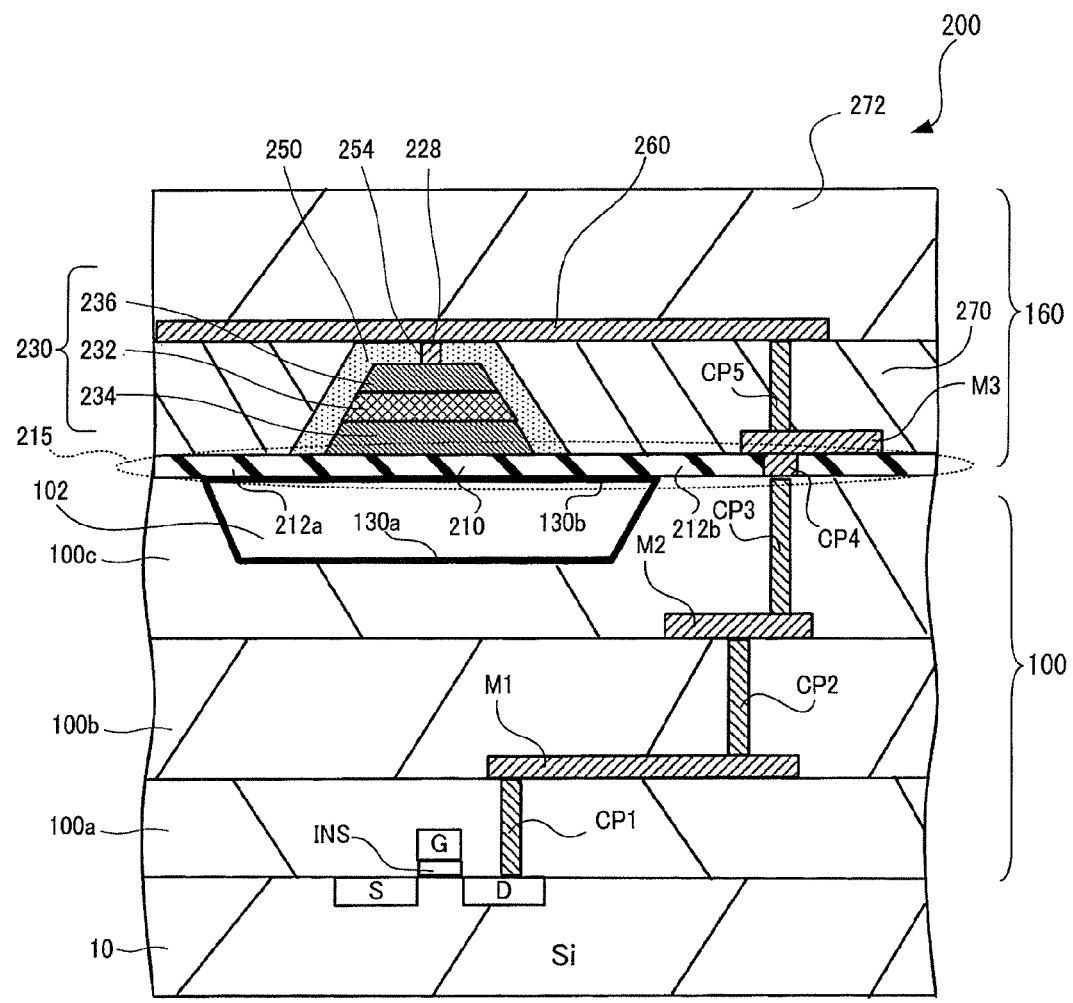
FIG. 16 is a diagram showing another example of the thermal detector.

FIG. 16 is a diagram showing another example of the thermal detector. With the thermal detector 200 shown in FIG. 16, the cavity 102 is formed for each individual heat-detecting element, and the support member (membrane) 215 is supported by the structure (part of the base part) that surrounds the cavity 102. In addition, a circuit constituent element (in this case, a MOS transistor) is formed in the region overlapping the heat-detecting element as seen in plan view. This MOS transistor is connected via multilayer wiring to the pyroelectric capacitor 230 that is used as the heat-detecting element. In the example of FIG. 16, the thermal transfer member 260 is utilized as wiring.

Specifically, a source layer (S) and a drain layer (D) are formed in the substrate (silicon substrate) 10. In addition, a gate insulating film INS and a gate electrode G (e.g., a polysilicon gate electrode) are formed on the substrate 10. As a result, a MOS transistor that serves as the circuit constituent element is formed.

The structure 100 including the insulating layer is formed on the substrate 10. The base (base) is constituted by the substrate 10 and the structure 100 including the insulating layer.

The structure 100 including the insulating layer is constituted by a multilayered structure, more specifically, a multilayer wiring structure. The multilayer wiring structure comprises a first insulating layer 100a, a second insulating layer 100b, a third insulating layer 100c, a first contact plug CP1, a first layer wiring M1, a second contact plug CP2, a second layer wiring M2, and a third contact plug CP3. Part of the third insulating layer 100c is selectively removed to form the cavity (thermal isolation cavity part) 102.

The pyroelectric capacitor 230 is formed as the heat-detecting element on the mounting part 210 of the support member (membrane) 215. In addition, the thermal transfer member 260 is formed between the first light-absorbing layer 270 and the second light-absorbing layer 272.

The element structure 160 is constituted by the support member (membrane) 215, the pyroelectric capacitor 230, the first light-absorbing layer 270, the second light-absorbing layer 272, the thermal transfer member 260, a fourth contact plug CP4, a third layer wiring M3, and a fifth contact plug CP5. As described above, the thermal transfer member 260 also functions as part of the wiring that connects the pyroelectric capacitor 230 that is used as the heat-detecting element to the other elements (in this case, a CMOS transistor that is formed on the substrate 10).

Specifically, as described above, the thermal transfer member 260 can be constituted by a metal compound such as MN or $AlO_x$, but because materials having metals as primary components also have favorable electrical conductivity, the thermal transfer member 260 can also be utilized as wiring (or part of the wiring) that connects the heat-detecting element to other elements. By using the thermal transfer member 260 as wiring, it is not necessary to provide separate wiring, and the production steps can be simplified. In addition, by disposing elements such as transistors in the region overlapping with the heat-detecting element, as seen in a plan view, it is possible to suppress any increase in the dedicated surface area for the entire thermal detector.

Thermal Detection Device

Figure 17:
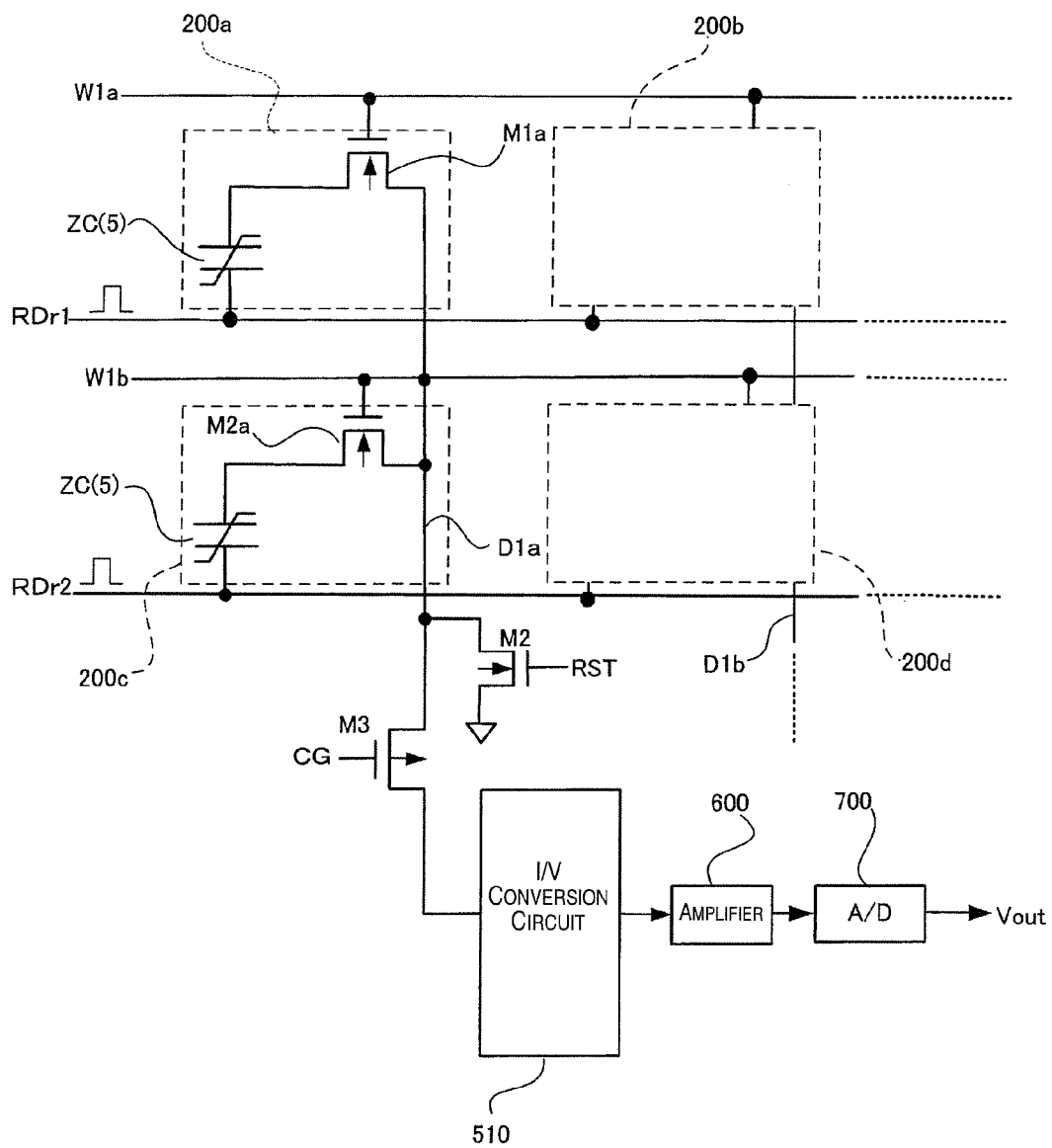
FIG. 17 is a circuit diagram showing an example of the circuit configuration of a thermal detection device (thermal detector array).

FIG. 17 is a circuit diagram that shows an example of a circuit configuration for the thermal detector (thermo-optical detection array). In the example of FIG. 17, a plurality of photodetecting cells (specifically, thermal detectors 200a to 200d) are disposed two-dimensionally. In order to select single photodetecting cells from among the plurality of photodetecting cells (thermal detectors 200a to 200d), scan lines (W1a, W1b, etc.) and data lines (D1a, D1b, etc.) are provided.

The thermal detector 200a that serves as a single photodetecting cell has an element-selection transistor M1a and a piezoelectric capacitor ZC that serves as the thermo-optical detecting element 5. The potential relationship between the two poles of the piezoelectric capacitor ZC can be inverted by switching the potential that is applied to PDr1 (by inverting this potential, it is not necessary to provide a mechanical chopper). Other photodetecting cells are similarly configured. The size of a region occupied by a single light-detecting cell is, for example, 20×20 μm.

The potential of the data line D1a can be initialized by turning on a reset transistor M2. When reading a detection signal, the read transistor M3 is ON. The current that is generated as a result of the pyroelectric effect is converted to voltage by an IN conversion circuit 510, amplified by an amplifier 600, and converted to digital data by an A/D converter 700.

In this embodiment, a plurality of thermal detectors is disposed two-dimensionally (for example, disposed in the form of an array along two respective perpendicular axes (X-axis and Y-axis)), thereby realizing a thermal detection device (thermal-type optical array sensor).

Electronic Instrument

Several embodiments for the electronic instrument will be described.

Infrared Camera

Figure 18:
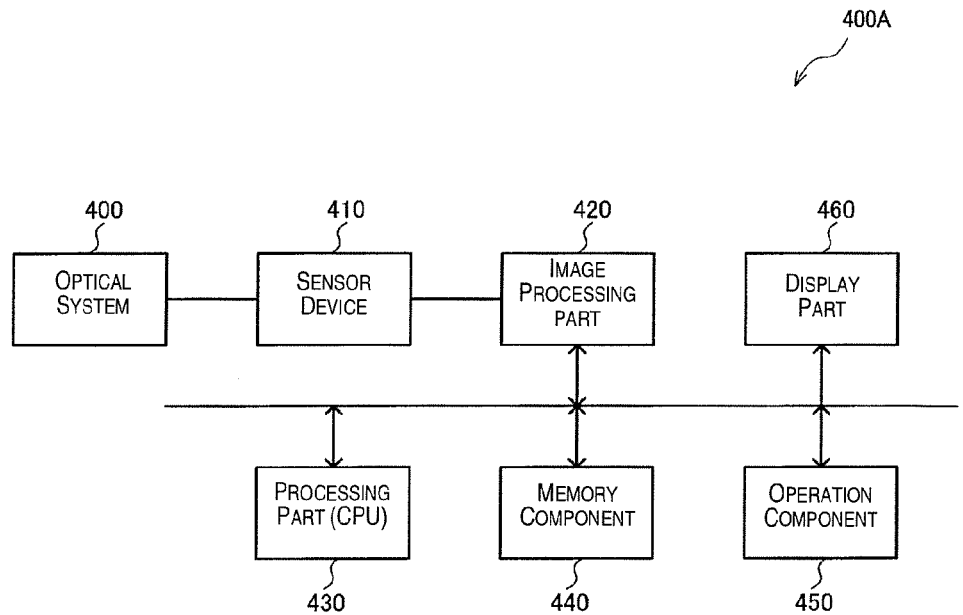
FIG. 18 is a block diagram of an infrared camera (electronic apparatus) that comprises a pyroelectric type detector or a pyroelectric type detection device.

FIG. 18 shows an example of the configuration of a pyroelectric type detector or an infrared camera 400A which is an example of an electronic instrument that comprises a pyroelectric type detection device of this embodiment. The infrared camera 400A comprises an optical system 400, a sensor device 410 (pyroelectric type detection device), an image processing part 420, a processing part 430, a memory component 440, an operation component 450, and a display part 460.

The optical system 400 includes, for example, one or a plurality of lenses and driving parts for driving these lenses. Imaging and the like of the subject is carried out on the sensor device 410. In addition, focus adjustment may be carried out as necessary.

The sensor device 410 has a configuration in which pyroelectric type detectors 200 of the embodiments described above are laid out two-dimensionally, and a plurality of lines (scan lines or word lines) and a plurality of columns (data lines) are provided. The sensor device 410 can also comprise line selection circuits (line drivers), a read circuit for reading data from the detectors via the columns, an A/D converter, and the like, in addition to the photodetectors that are laid out two-dimensionally. Because data is sequentially read from photodetectors that are laid out two-dimensionally, a captured image of the subject can be processed.

Based on the digital image data (pixel data) from the sensor device 410, the image processing part 420 carries out various image processing operations such as image correction processing.

The processing part 430 carries out control of the respective elements of the infrared camera 400A and overall control of the infrared camera 400A. This processing part 430 is realized, for example, in a CPU or the like. The memory component 440 stores various types of information, and, for example, functions as a work space for the processing part 430 or the image processing part 420. The operation component 450 is used as an interface for a user to operate the infrared camera 400A and can be realized, for example, in the form of various buttons, a GUI (graphical user interface) screen, or the like. The display part 460 displays the GUI screen, images that have been captured by the sensor device 410 and the like and is realized in the form of various types of displays, such as a liquid crystal display or organic EL display.

By using the thermal detector of a single cell as a sensor such as an infrared light sensor in this manner, and, by disposing the pyroelectric type photodetector of each cell along two axes, e.g., two perpendicular axes, a sensor device 410 can be configured. When this is done, it is possible to capture thermal (light) distribution images. By using this sensor device 410, it is possible to configure an electronic instrument such as a thermographic device or an on-board automotive night-vision camera or surveillance camera.

As shall be apparent, using the pyroelectric type detector of one cell or a plurality of cells as a sensor, it is possible to configure various types of electronic instruments, such as analytical instruments (measurement instruments) for analyzing (measuring) physical data related to an object, security instruments for detecting smoke or heat, and FA (factory automation) instruments that are installed in factories and the like.

On-Board Assistance Device

Figure 19:
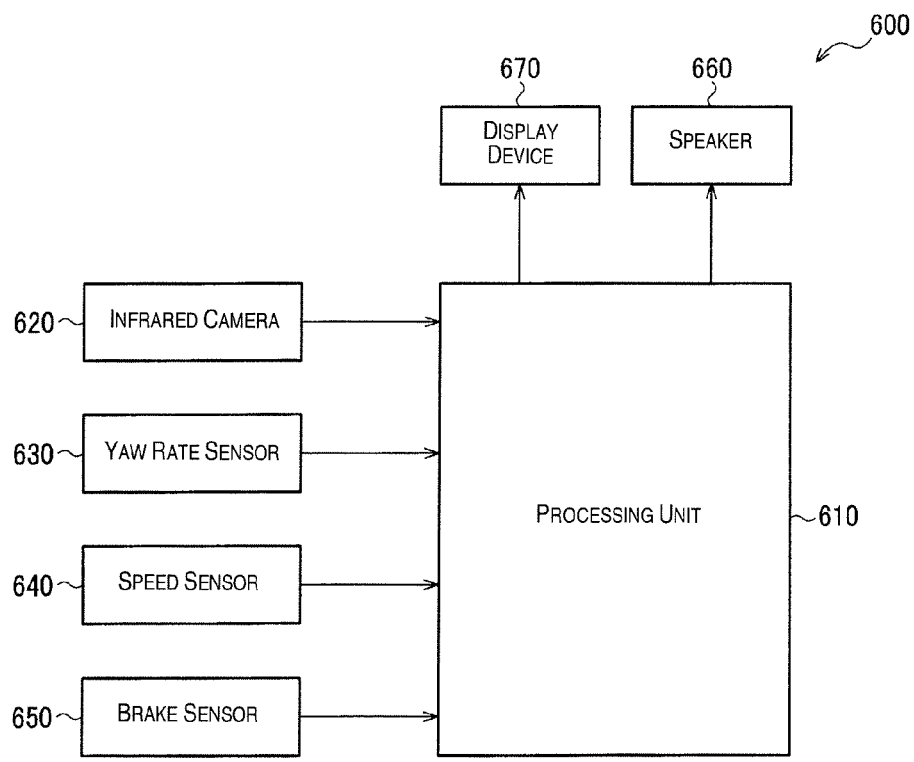
FIG. 19 is a diagram showing a drive assist device (electronic apparatus) comprising an infrared camera.

FIG. 19 shows a configuration example of an on-board assistance device 600 that is an example of an electronic instrument that comprises the pyroelectric detector or pyroelectric detection device of this embodiment. The on-board assistance device 600 has a configuration that comprises a processing unit 610 having a CPU that controls the on-board assistance device 600, an infrared camera 620 that allows detection of infrared light in a prescribed imaging region outside the automobile, a yaw rate sensor 630 that detects the automobile yaw rate, a speed sensor 640 that detects the travel speed of the automobile, a brake sensor 650 that detects operation of the brake by the driver, a speaker 660, and a display device 670.

The processing unit 610 of the on-board monitoring device 600 detects an object such as a pedestrian or a body that is present in advance of the travel direction of the automobile from infrared images of the periphery of the automobile obtained by imaging using the infrared camera 620 and signals related to the state of travel of the automobile that are detected by the respective sensors 630 to 650. When it is determined that contact between the automobile and a detected object may occur, a warning is output by the speaker 660 or the display device 670.

Figure 20:
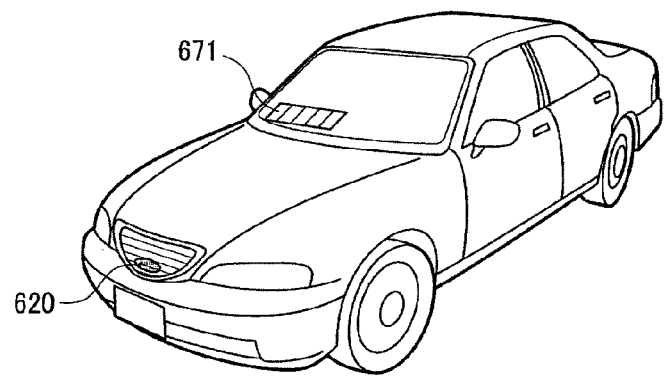
FIG. 20 is a diagram showing a vehicle having an on-board infrared camera at its front.

For example, as shown in FIG. 20, the infrared camera 620 is disposed near the middle along the front of the automobile. The display device 670 is configured by providing a HUD (heads-up display) 671 that displays various data in a position in the front window that does not obstruct the frontward field of view of the operator.

Security Instrument

Figure 21:
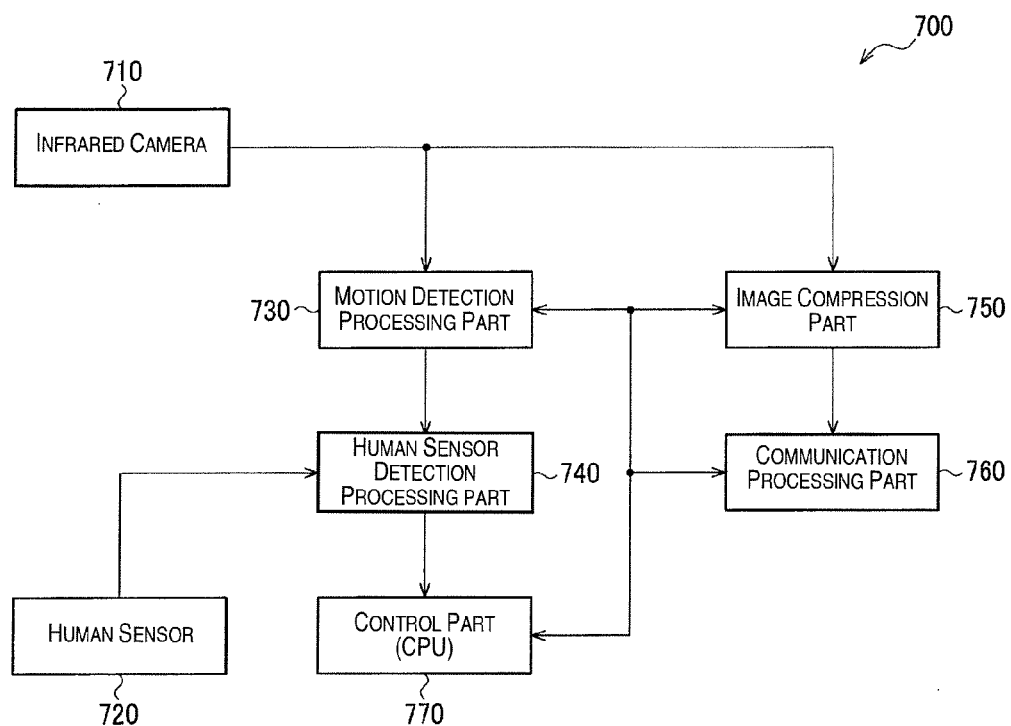
FIG. 21 is a diagram showing a security instrument (electronic instrument) comprising an infrared camera.

FIG. 21 shows an example of a security instrument 700 which is used as an example of an electronic instrument that comprises the pyroelectric type detector or pyroelectric type detection device of this embodiment.

The security instrument 700 comprises an infrared camera 710 that takes images of at least an area to be monitored, a human sensor 720 that detects intruders into the monitored area, a detection processing part 730 that acts to detect moving bodies that enter into the monitored area by processing image data that is output from the infrared camera 710, a human sensor detection processing part 740 that carries out detection processing for the human sensor 720, an image compression part 750 that compresses image data that has been output from the infrared camera 710 into a prescribed format, a communication processing part 760 that transmits compressed image data or intruder detection data and receives various types of setting information for the security instrument 700 from external devices, and a control part 770 that uses a CPU to carry out parameter setting, processing command transmission, and response processing with respect to various processing parts of the security instrument 700.

The motion detection processing part 730 has a buffer memory that is not shown in the drawings, a block data smoothing part whereby the output of the buffer memory is input, and a state modification detection part whereby the output of the block data smoothing part is input. The state modification detection part of the movement detection processing part 730 detects a change in state using the fact that the same image data will be present in different frames taken in movie mode if the monitored area is under static conditions, whereas a difference in image data between frames will arise when a change of state occurs (entry of a moving body).

Figure 22:
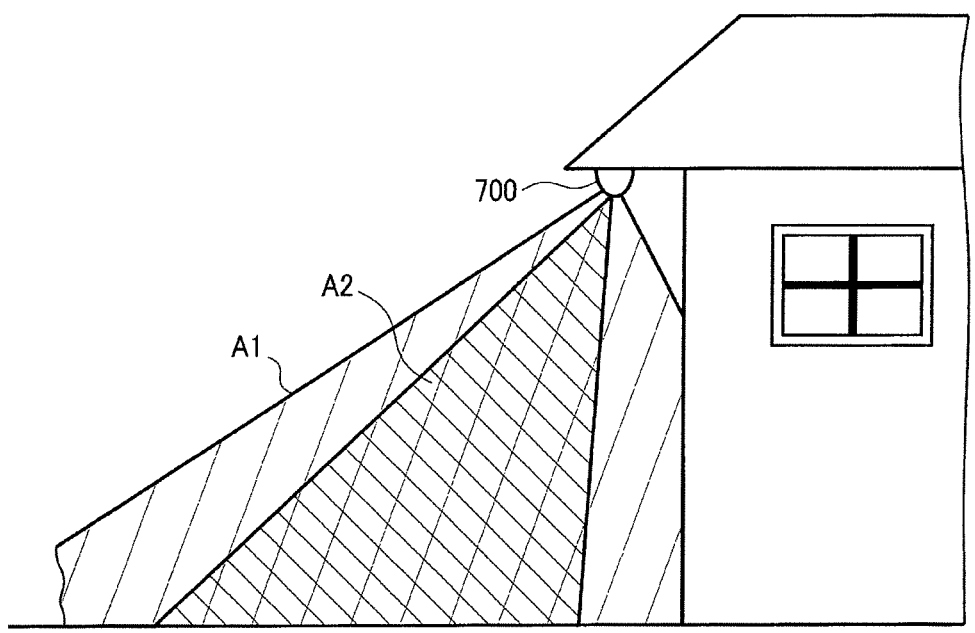
FIG. 22 is a diagram showing the detection area for a human sensor and an infrared camera in a security instrument.

FIG. 22 is a side view of a security instrument 700 that is installed, e.g., under a roof overhang, the imaging area A1 of the infrared camera 710 that is contained in the security instrument 700, and the detection area A2 of a human sensor 720.

Gaming Device

Figure 23:
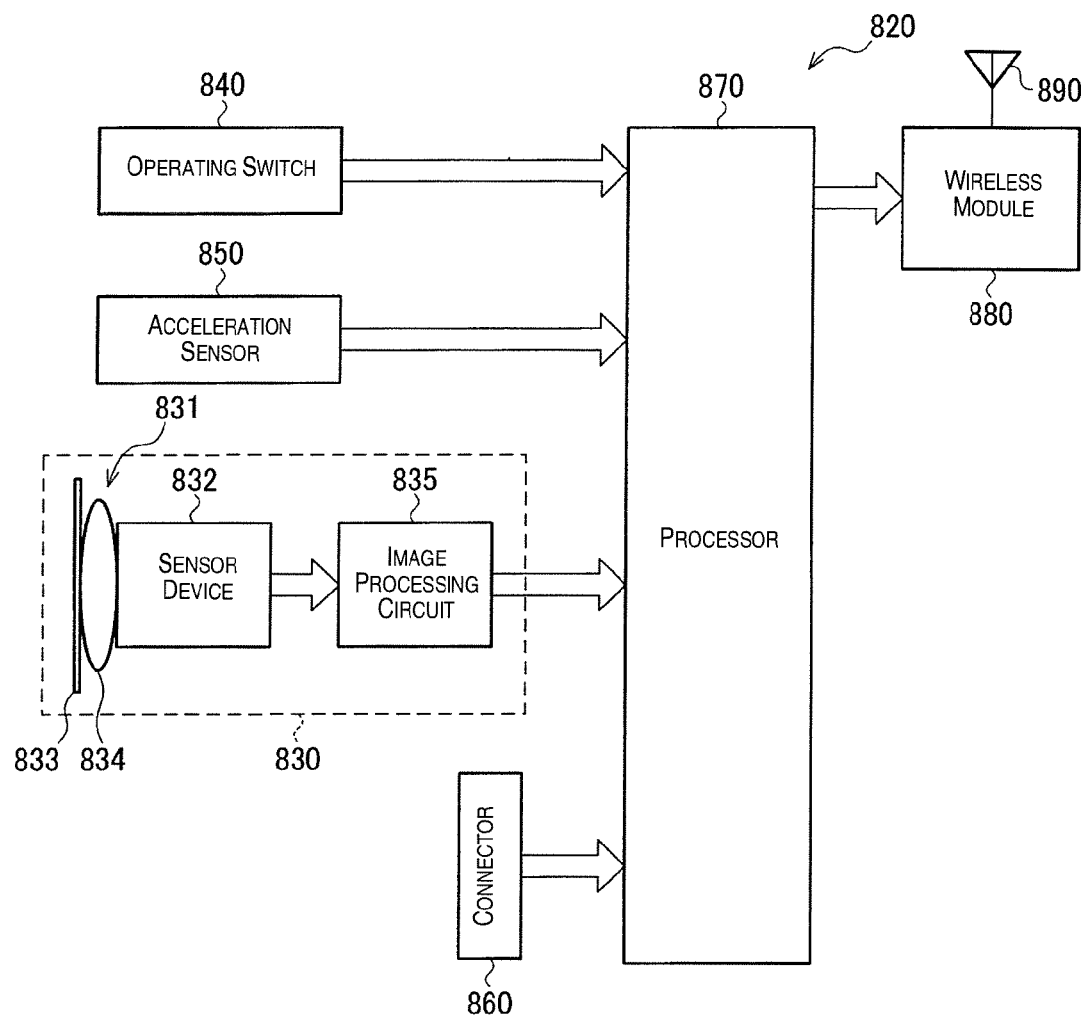
FIG. 23 is a diagram showing a controller used in a gaming device that has a sensor device.
Figure 24:
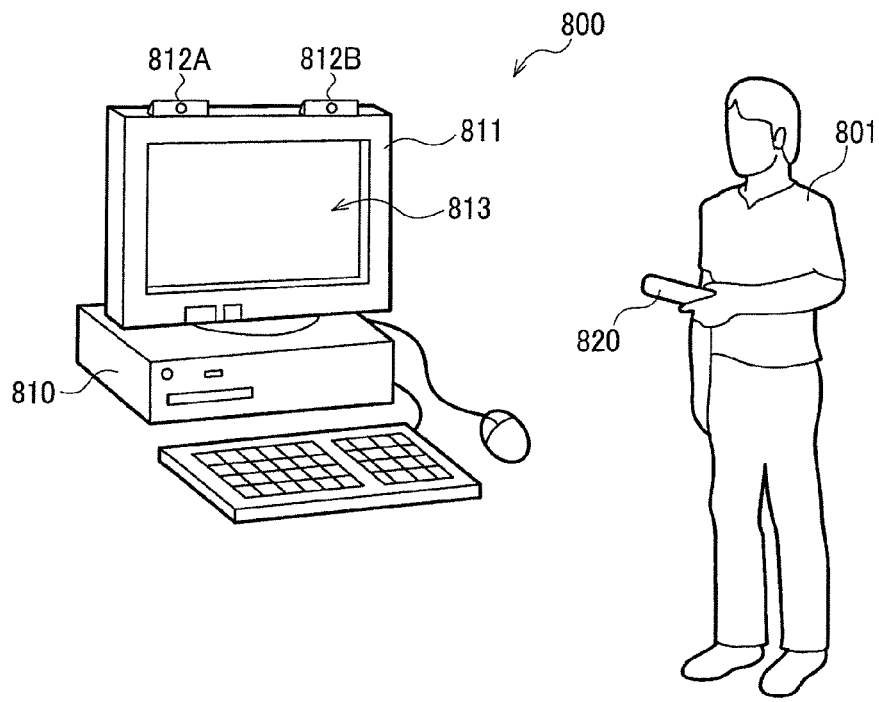
FIG. 24 is a diagram showing a gaming device that has a controller.

FIGS. 23 and 24 show an example of the configuration of a gaming device 800 that contains a controller 820 that utilizes the sensor device 410 described above, which is used as an example of an electronic instrument that contains the pyroelectric type detector or pyroelectric type detection device of this embodiment.

As shown in FIG. 23, the controller 820 that is used in the gaming device 800 of FIG. 24 has a configuration that comprises an image data computation unit 830, an operating switch 840, an acceleration sensor 850, a connecting portion 860, a processor 870, and a wireless module 880.

The imaging data computation unit 830 has an image capture unit 831 and an image processing circuit 835 for processing the image data that has been captured by the image capture unit 831. The image capture unit 831 includes a sensor device 832 (sensor device 410 of FIG. 18), there being an infrared filter 833 (that admits only infrared light) and an optical system (lens) 834 disposed in front thereof. The image processing circuit 835 processes the infrared image data obtained from the image capture unit 831, detects high-brightness portions, detects the centers of gravity and the surface areas thereof, and then outputs these data.

The processor 870 outputs, as a series of control data, operational data obtained from the operating switch 840 and acceleration data obtained from the acceleration sensor 850, as well as high-brightness data. The wireless module 880 modulates a carrier signal of a prescribed frequency with the control data and outputs a signal from the antenna 890 as a radio signal.

The data that has been input through the connecting portion 860 that is provided on the controller 820 is processed by the processor 870 in the same manner as the data described above and is output via the wireless module 880 and the antenna 890.

As shown in FIG. 24, the gaming device 800 has a controller 820, a gaming device main unit 810, a display 811, and LED modules 812A and 812B. The player 801 uses one hand to grasp the controller 820 to play the game. When the image capture unit 831 of the control 820 is facing the screen 813 of the display 811, infrared light that is output from the LED modules 812A and 812B that are disposed near the display 811 is detected by the image capture unit 831, and the controller 820 acquires surface area and position information of the two LED modules 812A and 812B as high-brightness point information. Data concerning the positions and sizes of the bright points is transmitted wirelessly from the controller 820 to the gaming device main unit 810 and is received by the gaming device main unit 810. When the player 801 moves the controller 820, the position and size data of the bright points change, and this change is used in order to allow the gaming device main unit 810 to acquire operational signals corresponding to movement of the controller 820, thereby allowing gaming to progress.

Body Temperature Measurement Device

Figure 25:
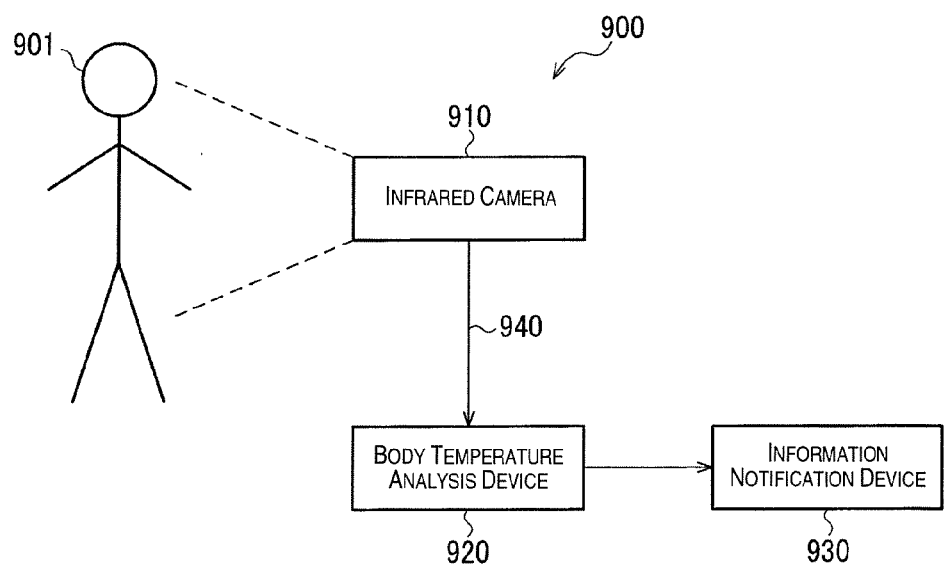
FIG. 25 is a diagram showing a body temperature measurement device (electronic instrument) that has an infrared camera.

FIG. 25 shows an example of the configuration of a body temperature measurement device 900 which is used as an example of the electronic instrument of this embodiment that contains the pyroelectric type detector or pyroelectric type detection device.

As shown in FIG. 25, the body temperature measurement device 900 has a configuration that comprises an infrared camera 910, a body temperature analysis device 920, an information notification device 930, and a cable 940. The infrared camera 910 has a configuration that comprises an optical system such as a lens (not shown), and the aforementioned sensor device 410.

The infrared camera 910 images a target region, and image data related to the subject 901 whose image has been captured is transmitted to the body temperature analysis device 920 via the cable 940. The body temperature analysis device 920 (not shown) comprises an image reading processing unit that reads the heat distribution image from the ultraviolet camera 910, a body temperature analysis unit that generates a body temperature analysis table based on an image analysis settings table together with data from the image reading processing unit and transmits body temperature transmission data based on the body temperature analysis table to the information notification device 930. This body temperature transmission data may also include predetermined data for when the body temperature is abnormal. When it is determined that a plurality of subjects 901 are in the image capture region, the body temperature transmission data also includes information concerning the number of subjects 901 and the number of persons having an abnormal body temperature.

Specified Substance Searching Device

Figure 26:
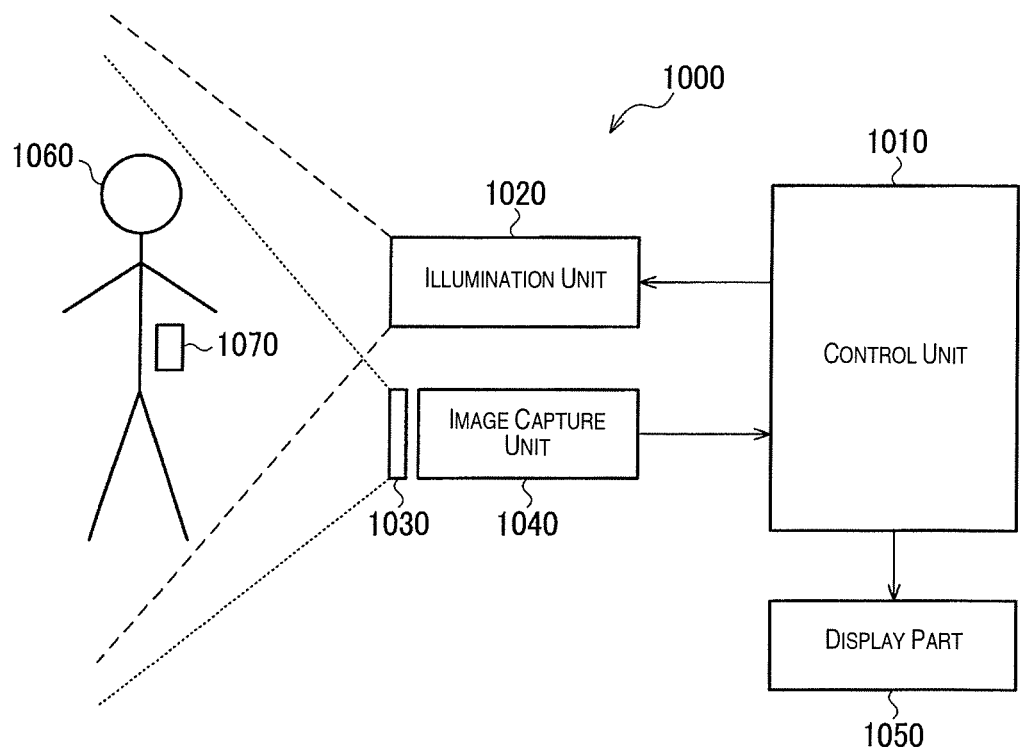
FIG. 26 is a diagram showing an example of a configuration in which a sensor device is used as a terahertz sensor device in combination with a terahertz irradiation unit in a special material inspection device (electronic instrument).

FIG. 26 shows an example of the configuration of a specified substance search device 1000 that combines a terahertz illumination unit along with a terahertz light sensor device in the form of a sensor device having a terahertz range for the absorption wavelengths of the light-absorbing material of the pyroelectric type detector of the sensor device 410 described above. This device is used as an example of an electronic device of this embodiment that contains a pyroelectric type detector or pyroelectric type detection device.

The specified substance searching device 1000 has a configuration that comprises a control unit 1010, an illumination unit 1020, an optical filter 1030, an image capture unit 1040, and a display part 1050. The image capture unit 1040 has a configuration that comprises an optical system such as a lens, and a sensor device having a terahertz absorption wavelength range for the light-absorbing material of the aforementioned pyroelectric type detector (neither of which being shown in the drawing).

The control unit 1010 includes a system controller, where the system controller controls the entire device and controls the image processing unit and the light source drive part included in the control unit. The illumination unit 1020 includes an optical system and a laser device that emits terahertz light (electromagnetic radiation in the wavelength range of 100 to 1000 μm), thereby illuminating the person 1060 who is the subject of inspection with terahertz light. The reflected terahertz light from the person 1060 is received by the image capture unit 1040 via the optical filter 1030 that allows only light in the spectrum of the specified substance 1070 that is the target of investigation to pass. The image signal that is generated by the image capture unit 1040 is subjected to prescribed image processing by the image processing unit of the control unit 1010, and the image signal is output to the image display part 1050. The presence of a specified substance 1070 can be determined depending on the intensity of the received light signals which differ depending on whether the specified substance 1070 is present in the clothing or the like of the human 1060.

A number of embodiments of electronic instruments were described above, but the electronic instruments of the embodiments described above are not restricted by the configurations that have been presented, and various modifications may be implemented that involve elimination of some of the constituent elements (e.g., optical system, operational part, display part) and addition of other constituent elements.

Sensor Device

Figure 27A:
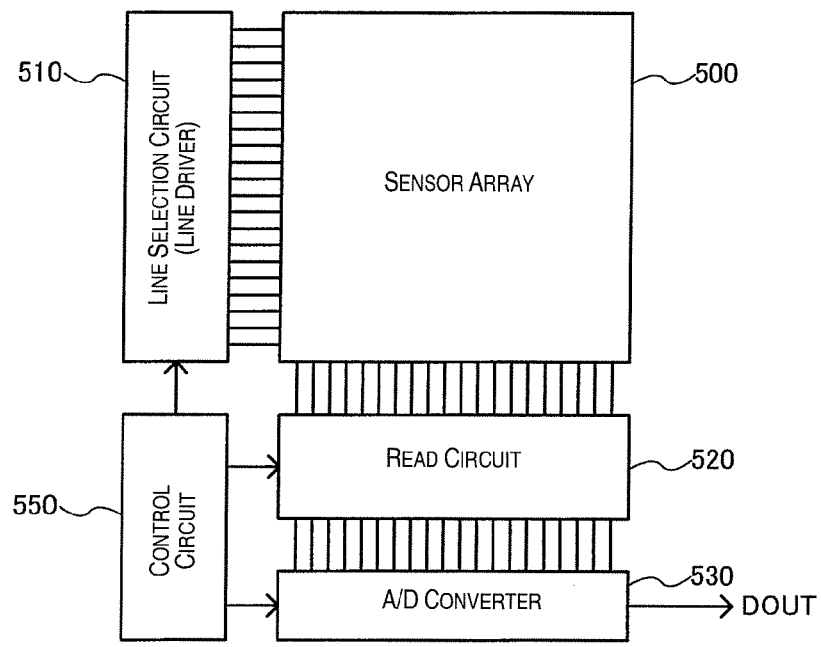
FIGS. 27A and 27B are diagrams showing an example of the configuration of a pyroelectric type detection device in which pyroelectric detectors are disposed two-dimensionally.

An example of the configuration of a sensor device 410 of FIG. 18 is shown in FIG. 27A. This sensor device comprises a sensor array 500, a line selection circuit (line driver) 510, and a read circuit 520. The device may also comprise an A/D conversion part 530 and a control circuit 550. The line selection circuit (line driver) 510 and the read circuit 520 are referred to as the "driver circuit." As shown in FIG. 5, this sensor device can be used in an infrared camera 400A that is used, for example, in a navigation device.

In the sensor array 500, a plurality of sensor cells are arranged (disposed) along two axes as shown, for example, in FIG. 17. The number of lines and columns may also be one. For example, when the number of lines is one, a plurality of sensor cells are arranged in the row direction (horizontal direction) in FIG. 27A. On the other hand, when the number of columns is one, a plurality of sensor cells is arranged in the column direction (vertical direction).

Figure 27B:
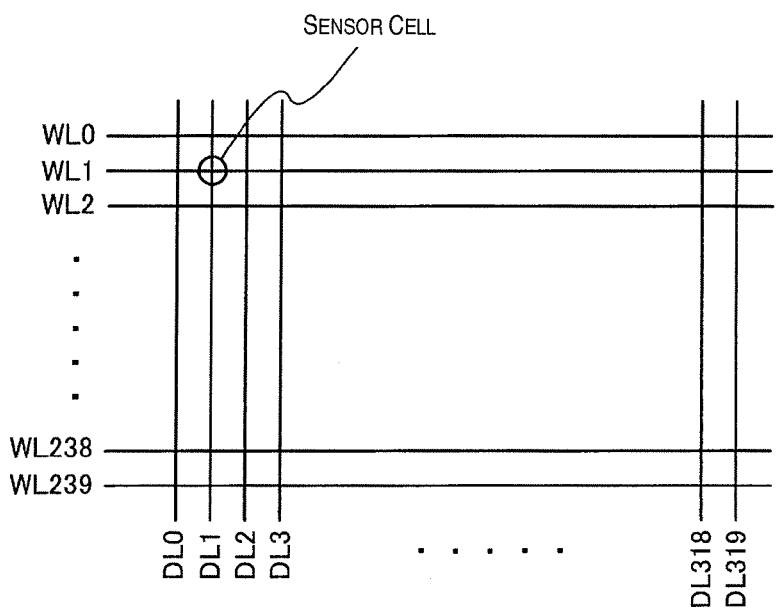

As shown in FIG. 27B, each of the sensor cells of the sensor array 500 is disposed (formed) at a location corresponding to the intersection position of a row and a column. With the sensor cell shown in FIG. 27B, the cells are disposed at a location corresponding to the intersection of the row WL1 and the column DL1. The other sensor cells are similar.

The row selection circuit 510 is connected to one or a plurality of rows, and the selection operation for each row is thereby carried out. For example, taking the sensor array 500 (focal plan array) of a QVGA (320×240 pixels) device shown in FIG. 27B as an example, operation is carried out by the sequential selection (scanning) of rows WL0, WL1, WL2, . . . WL239. Specifically, signals for selecting these rows (word selection signals) are output to the sensor array 500.

The read circuit 520 is connected to one or a plurality of columns. Read operations are thereby carried out on respective columns. Taking the QVGA sensor array 500 as an example, a reading operation is carried out on the detection signals (detected current, detected charge) from the columns DL0, DL1, DL2, . . . DL319.

The A/D conversion part 530 carries out processing whereby the detected voltage (measured voltage, attained voltage) acquired by the read circuit 520 is subjected to A/D conversion to produce digital data. Digital data DOUT is thus output after A/D conversion. Specifically, respective A/D converters corresponding to each column of the plurality of columns are provided in the A/D conversion part 530. The respective A/D converters carry out A/D conversion on the detected voltages that have been acquired by the read circuit 520 for the corresponding columns. A single A/D converter may also be provided for a plurality of columns, and the detected voltages for the plurality of columns may be subjected to time-division A/D conversion using this single A/D converter.

The control circuit 550 (timing generation circuit) generates various types of control signals which are output to the line selection circuit 510, the read circuit 520, and the AD conversion part 530. For example, a charge or discharge (reset) control signal is generated and output. Alternatively, a signal that controls the timing for each of the circuits is generated and output.

While only selected embodiments have been described, it will be readily apparent to those skilled in the art from the novel matters and effects of the present invention that numerous modifications may be made herein without substantially departing from the scope of the invention. Consequently, all modifications such as the above may be understood to fall within the scope of the invention. Terms disclosed together with different equivalent or broader terms in at least one instance in the specification or drawings, for example, may be replaced by these different terms at any place in the specification or drawings.

The present invention can be widely utilized in various types of pyroelectric type detectors (e.g., thermopile elements (thermopiles) and pyroelectric type elements) without concern regarding the wavelength of the light that is to be detected. In addition, pyroelectric type detectors or pyroelectric type detection devices, or electronic instruments that contain them, for example, may be utilized in flow sensors and the like for detecting the flow rate of fluids under conditions in which there is equilibrium between the heat that is given off and the heat that is taken in by the fluid. The pyroelectric type detector or pyroelectric type detection device of the present invention may be provided instead of a thermo-couple or the like in the flow sensor, and the subject of detection can thus be something other than light.

As described above, in accordance with at least one embodiment of the present invention, the detection sensitivity of a thermal detector, for example, can be additionally improved.

While only selected embodiments have been described, it will be readily apparent to those skilled in the art from the novel matters and effects of the present invention that numerous modifications may be made herein without substantially departing from the scope of the invention. Consequently, all modifications such as the above may be understood to fall within the scope of the invention. Terms disclosed together with different equivalent or broader terms in at least one instance in the specification or drawings, for example, may be replaced by these different terms at any place in the specification or drawings.

GENERAL INTERPRETATION OF TERMS

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts. Also as used herein to describe the above embodiments, the following directional terms "top", "bottom", "upper", "lower", "forward", "rearward", "above", "downward", "vertical", "horizontal", "below" and "transverse" as well as any other similar directional terms refer to those directions of the thermal detector when the thermal detector is oriented as shown in FIG. 1B. Finally, terms of degree such as "substantially", "about" and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. All modifications such as described above may be understood to fall within the scope of the invention. Terms disclosed together with different equivalent or broader terms in at least one instance in the specification or drawings, for example, may be replaced by these different terms at any place in the specification or drawings.

What is claimed is:

1. A thermal detector comprising:
   a substrate;
   a support member supported on the substrate so that a cavity is formed between the substrate and the support member;
   a heat-detecting element supported on the support member;

a thermal transfer member disposed over the heat-detecting element, the thermal transfer member including
a thermal collecting portion made of a material having light-reflecting characteristics and having a pattern with which a portion of light incident to a region defined by the support member as seen in plan view enters towards the support member, and
a connecting portion connecting the thermal collecting portion to the heat-detecting element;
a first light-absorbing layer contacting the thermal transfer member and disposed between the thermal transfer member and the support member; and
a second light-absorbing layer contacting the thermal transfer member and disposed on the thermal transfer member.

2. The thermal detector according to claim 1, wherein
the pattern of the thermal collecting portion of the thermal transfer member has a shape in which a plurality of extension parts extend from the connecting portion towards outer edges of the support member, as seen in plan view.

3. The thermal detector according to claim 2, wherein
at least one of the extension parts including one of
a curved part that curves with respect to a direction in which the extension part extends from the connecting portion, and
a diverging branch part branching off from a linear portion of the extension part.

4. An electronic instrument comprising:
the thermal detector according to claim 3; and
a control part configured to process an output of the thermal detector.

5. The thermal detector according to claim 2, wherein
the extension parts are arranged symmetrically about a point on the connecting portion as seen in plan view.

6. An electronic instrument comprising:
the thermal detector according to claim 2; and
a control part configured to process an output of the thermal detector.

7. The thermal detector according to claim 1, wherein
the pattern of the thermal collecting portion of the thermal transfer member has an annular part encompassing the connecting portion as seen in plan view.

8. The thermal detector according to claim 7, wherein
the pattern of the thermal collecting portion of the thermal transfer member has a linear part connecting two locations of the annular part with the linear part being disposed inside the annular part as seen in plan view.

9. The thermal detector according to claim 7, wherein
the pattern of the thermal collecting portion of the thermal transfer member has an additional extension part extending from a part of the annular part towards an outside of the annular part as seen in plan view.

10. The thermal detector according to claim 1, wherein
the pattern of the thermal collecting portion of the thermal transfer member has a shape in which a region defined by an outer circumference of a closed shape, as seen in plan view, includes at least one cut-out part.

11. The thermal detector according to claim 1, wherein
the pattern of the collecting portion in the thermal transfer member has a plurality of isolated patterns, as seen in plan view, and
the connecting portion is provided for each of the isolated patterns.

12. The thermal detector according to claim 1, wherein
the first light-absorbing layer is formed on the support member around the heat-detecting element, and
the second light-absorbing layer contacts the support member and the detecting element.

13. The thermal detector according to claim 12, wherein
light of a first wavelength resonates between a surface of the support member on which the heat-detecting element is mounted and an upper surface of the second light-absorbing layer, and
light of a second wavelength, which is different from the first wavelength, resonates between a lower surface of the second light-absorbing layer and the upper surface of the second light-absorbing layer.

14. A thermal detection device comprising a plurality of the thermal detectors according to claim 1 arranged two-dimensionally.

15. An electronic instrument comprising:
the thermal detection device according to claim 14; and
a control part configured to process an output of the thermal detector.

16. The thermal detector according to claim 1, wherein
the thermal detector is configured and arranged to detect infrared light.

17. An electronic instrument comprising:
the thermal detector according to claim 16; and
a control part configured to process an output of the thermal detector.

18. The thermal detector according to claim 1, wherein
the thermal detector is configured and arranged to detect terahertz light.

19. An electronic instrument comprising:
the thermal detector according to claim 1; and
a control part configured to process an output of the thermal detector.

20. A thermal detector manufacturing method comprising:
forming a structure including an insulating layer on a surface of a substrate;
forming a sacrificial layer on the structure including the insulating layer;
forming a support member on the sacrificial layer;
forming a heat-detecting element on the support member;
forming a first light-absorbing layer so as to cover the heat-detecting element, and planarizing the first light-absorbing layer;
forming a contact hole in a part of the first light-absorbing layer, and subsequently forming a thermal transfer member disposed over the heat-detecting element and made of a material having light-reflective characteristics with respect to light incident on a region of the support member, the thermal transfer member having a thermal collecting portion made of a material having light-reflecting characteristics and having a pattern with which a portion of light incident to a region defined by the support member as seen in plan view enters towards the support member, and a connecting portion connecting the thermal collecting portion to the heat-detecting element;
forming a second light-absorbing layer on the first light-absorbing layer;
patterning the first light-absorbing layer and the second light-absorbing layer;
patterning the support member; and
removing the sacrificial layer to form a cavity between the support member and the structure including the insulating layer, which is formed on the surface of the substrate.

* * * * *